United States Patent
Lee et al.

(10) Patent No.: US 11,462,690 B2
(45) Date of Patent: Oct. 4, 2022

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventors: Jungsub Lee, Hwaseong-si (KR); Hyein Jeong, Suwon-si (KR); Hyejeong Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 269 days.

(21) Appl. No.: 16/545,950

(22) Filed: Aug. 20, 2019

(65) Prior Publication Data
US 2020/0176684 A1 Jun. 4, 2020

(30) Foreign Application Priority Data
Nov. 29, 2018 (KR) .......................... 10-2018-0151038

(51) Int. Cl.
*H01L 51/00* (2006.01)
*H01L 51/50* (2006.01)

(52) U.S. Cl.
CPC ........ *H01L 51/0059* (2013.01); *H01L 51/008* (2013.01); *H01L 51/0069* (2013.01);
(Continued)

(58) Field of Classification Search
CPC ............... H01L 51/008; H01L 51/0059; H01L 51/0069; H01L 51/0071; C07F 5/02;
(Continued)

(56) References Cited

U.S. PATENT DOCUMENTS 9,073,948 B2 7/2015 Kottas et al.
9,882,147 B2 1/2018 Lee et al.
(Continued)

FOREIGN PATENT DOCUMENTS

EP 3 109 253 A1 12/2016
KR 10-1785755 B1 10/2017
(Continued)

*Primary Examiner* — Alexander C Kollias
(74) *Attorney, Agent, or Firm* — Lewis Roca Rothgerber Christie LLP

(57) ABSTRACT

An organic electroluminescence device includes a first electrode; a second electrode on the first electrode; and a plurality of organic layers between the first electrode and the second electrode, where a polycyclic compound represented by Formula 1-1 or Formula 1-2 is included in at least one organic layer of the plurality of organic layers. The polycyclic compound is represented by Formula 1-1 or Formula 1-2.

(Continued)

-continued

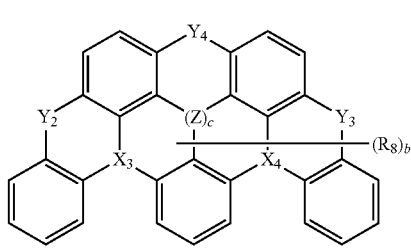

Formula 1-2

20 Claims, 2 Drawing Sheets

(52) U.S. Cl.
CPC ...... H01L 51/5012 (2013.01); H01L 51/5056 (2013.01); H01L 51/5072 (2013.01)

(58) Field of Classification Search
CPC ...... C09K 2211/104; C09K 2211/1055; C09K 2211/1085
See application file for complete search history.

(56) References Cited

U.S. PATENT DOCUMENTS

| 2018/0019415 | A1 | 1/2018 | Nakano et al. |
| 2018/0040821 | A1 | 2/2018 | Hatakeyama et al. |
| 2018/0069182 | A1* | 3/2018 | Hatakeyama ............ C07F 9/90 |

FOREIGN PATENT DOCUMENTS

| KR | 10-2017-0126888 A | 11/2017 |
| KR | 10-2018-0007727 A | 1/2018 |
| KR | 10-1846620 B1 | 4/2018 |
| KR | 10-1846619 B1 | 5/2018 |
| KR | 10-1886773 B1 | 8/2018 |
| WO | WO 2015/072537 A1 | 5/2015 |

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2018-0151038, filed on Nov. 29, 2018, the entire contents of which are incorporated herein by reference.

BACKGROUND

The development of an organic electroluminescence display device as an image display device is being actively conducted. Unlike a liquid crystal display device, the organic electroluminescence display device is a so-called self-luminescent display device in which holes and electrons injected from a first electrode and a second electrode, respectively, are recombined in an emission layer, and a light emission material, which is an organic compound included in the emission layer, emits light to realize a display.

As an example of the organic electroluminescence device, for example, an organic device may include: a first electrode; a hole transport layer on the first electrode; an emission layer on the hole transport layer; an electron transport layer on the emission layer; and a second electrode on the electron transport layer. Holes are injected from the first electrode, and the injected holes move through the hole transport layer and are injected into the emission layer. On the other hand, electrons are injected from the second electrode, and the injected electrons move through the electron transport layer and are injected into the emission layer. The holes and the electrons injected into the emission layer are recombined, thereby generating excitons in the emission layer. The organic electroluminescence device emits light by using the light generated when the excitons fall back (e.g., transition or relax) to a ground state.

In application of an organic electroluminescence device to a display device, an organic electroluminescence device having a low driving voltage, high luminous efficiency and a long life-time has been beneficial, and, accordingly, development of materials for an organic electroluminescence device capable of stably realizing the requirements has been studied.

SUMMARY

Embodiments of the present disclosure provide an organic electroluminescence device and a polycyclic compound used therefor.

An embodiment of the present disclosure provides an organic electroluminescence device including: a first electrode; a second electrode on the first electrode; and a plurality of organic layers between the first electrode and the second electrode, wherein the first electrode and the second electrode each independently include at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides thereof, and wherein at least one organic layer of the organic layers may include a polycyclic compound represented by Formula 1-1 or Formula 1-2:

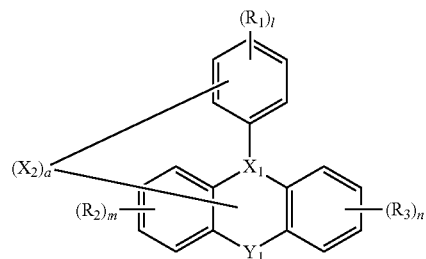

Formula 1-1

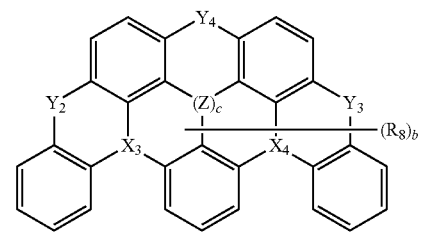

Formula 1-2

In Formula 1-1, $R_1$ to $R_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to adjacent groups to form a condensed polycyclic ring, and l to n may each independently be an integer of 0 to 4.

$X_1$ may be B or N, $X_2$ may be $BR_{1\text{-}1}$ or $NR_{1\text{-}2}$, and $R_{1\text{-}1}$ and $R_{1\text{-}2}$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The subscript a may be 1 or 2, $Y_1$ may be O, S, $BR_4$ or $NR_5$, and $R_4$ and $R_5$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to adjacent groups to form a condensed polycyclic ring.

At least one of $R_1$ to $R_5$ may be bonded to adjacent groups to form a condensed polycyclic ring having a B-N direct bond, or may be a heteroaryl group having a B-N direct bond.

In Formula 1-2, $X_3$ and $X_4$ may each independently be B or N, $Y_2$ to $Y_4$ may each independently be $BR_6$, $NR_7$, O or S, and $R_6$ and $R_7$ may each independently be a hydrogen atom, a deuterium atom, a substituted or unsubstituted alkyl group having 1 to 30 carbon atoms, or a substituted or unsubstituted aryl group having 6 to 30 ring-forming carbon atoms. For example, $R_6$ and $R_7$ may be unsubstituted phenyl groups.

$R_8$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. The subscript b may be an integer of 0 to 15, Z may be B or N, and c may be 0 or 1.

In an embodiment, the polycyclic compound may be represented by Formula 2-1-1 or Formula 2-1-2:

Formula 2-1-1

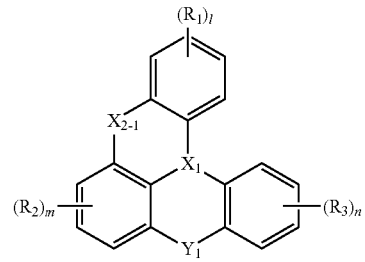

Formula 2-1-2

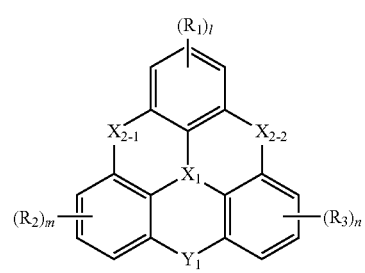

In Formula 2-1-1 and Formula 2-1-2, $X_{2-1}$ and $X_{2-2}$ may each independently be $BR_{1-1}$ or $NR_{1-2}$, and $R_1$ to $R_3$, l to n, $X_1$, $Y_1$, $R_{1-1}$ and $R_{1-2}$ may be the same as defined in Formula 1-1.

In an embodiment, the polycyclic compound may be represented by Formula 3-1-1 or Formula 3-1-2:

Formula 3-1-1

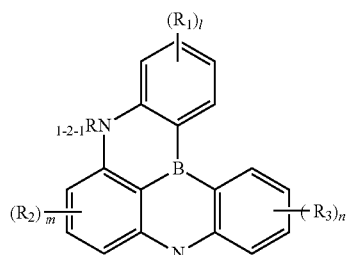

Formula 3-1-2

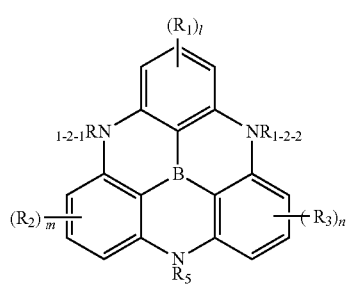

In Formula 3-1-1 and Formula 3-1-2, $NR_{1-2-1}$ and $NR_{1-2-2}$ may each independently be $NR_{1-2}$, and $R_1$ to $R_3$, l to n, $R_{1-2}$ and $R_5$ may be the same as defined in Formula 1-1.

In an embodiment, the polycyclic compound may be represented by Formula 4-1:

Formula 4-1

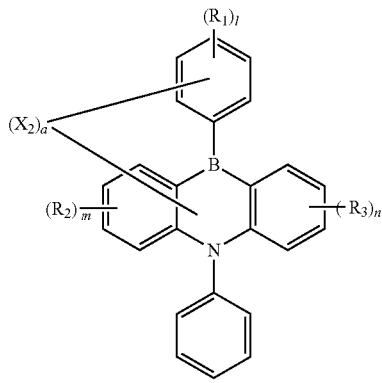

In Formula 4-1, $R_1$ to $R_3$, l to n, $X_2$ and a may be the same as defined in Formula 1-1.

In an embodiment, the polycyclic compound may be represented by Formulae 2-2-1 to 2-2-3:

Formula 2-2-1

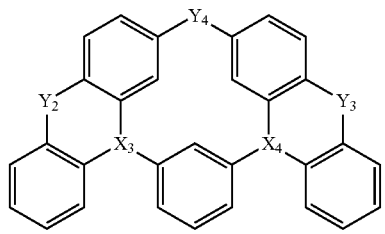

Formula 2-2-2

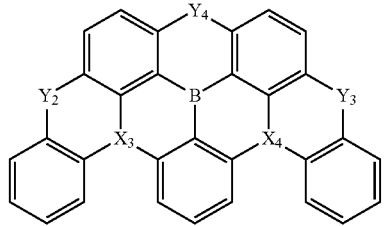

Formula 2-2-3

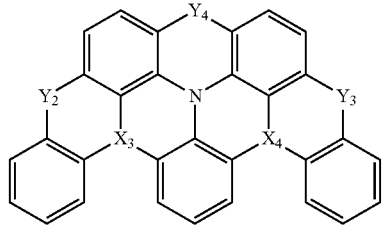

In Formulae 2-2-1 to 2-2-3, $X_3$, $X_4$ and $Y_2$ to $Y_4$ may be the same as defined in Formula 1-2.

In an embodiment, two or three selected from $X_3$, $X_4$ or $Y_2$ to $Y_4$ in Formula 1-2 may contain B.

In an embodiment, the organic layers may respectively include: a hole transport region on the first electrode; an emission layer on the hole transport region; and an electron transport region on the emission layer, wherein the emission layer may include a polycyclic compound.

In an embodiment, the emission layer may include a host and a dopant, and the dopant may contain the polycyclic compound. The emission layer may be configured to emit blue light in a wavelength range of 440 to 490 nm. In an embodiment, the polycyclic compound may be a thermally activated delayed fluorescent dopant.

In an embodiment, the polycyclic compound may include at least one of the compounds represented in Compound Group 1.

An embodiment of the present disclosure provides a polycyclic compound represented by Formula 1-1 or Formula 1-2 described above.

BRIEF DESCRIPTION OF THE FIGURES

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
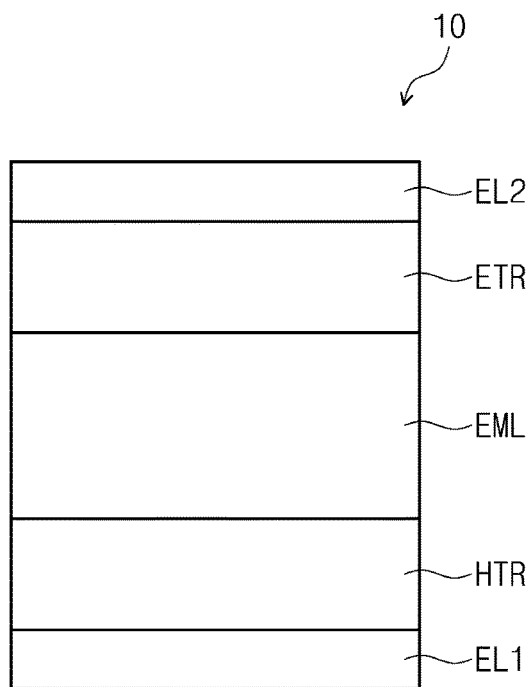
FIG. 1 is a cross-sectional view schematically illustrating an organic electroluminescence device according to an embodiment of the present disclosure.

The subject matter of the present disclosure may have various modifications and may be embodied in different forms, and example embodiments will be explained in more detail with reference to the accompany drawings. The subject matter of the present disclosure may, however, be embodied in different forms and should not be construed as limited to the embodiments set forth herein. Rather, all modifications, equivalents, and substituents which are included in the spirit and technical scope of the present disclosure should be included in the present disclosure.

Like reference numerals refer to like elements throughout. In the drawings, the dimensions of structures may be exaggerated for clarity of illustration. It will be understood that, although the terms first, second, etc. may be used herein to describe various elements, these elements should not be limited by these terms. These terms are only used to distinguish one element from another element. Thus, a first element could be termed a second element without departing from the spirit and scope of the present disclosure. Similarly, a second element could be termed a first element. As used herein, the singular forms are intended to include the plural forms as well, unless the context clearly indicates otherwise.

In the present description, it should be understood that the term "comprise" or "have" intends to mean that there may be specified features, numerals, acts, operations, elements, parts, or combinations thereof, not excluding the possibility of the presence or addition of the specified features, numerals, acts, operations, elements, parts, or combinations thereof.

In the present description, when a layer, a film, a region, a plate, etc. is referred to as being "on" or "above" another part, it can be "directly on" the other part, or intervening layers may also be present. In contrast, when a layer, a film, a region, a plate, etc. is referred to as being "under" or "below" another part, it can be "directly under" the other part, or intervening layers may also be present. Additionally, the term "on" in the present description may include the case where it is on the lower part as well as on the upper part. In addition, it will also be understood that when an element or layer is referred to as being "between" two elements or layers, it can be the only element or layer between the two elements or layers, or one or more intervening elements or layers may also be present.

In the present description, the term "substituted or unsubstituted" corresponds to substituted or unsubstituted with at least one substituent selected from the group consisting of a deuterium atom, a halogen atom, a cyano group, a nitro group, an amino group, a hydroxyl group, a silyl group, a boron group, a phosphine oxide group, a phosphine sulfide group, an alkyl group, an alkenyl group, an alkoxy group, an aryloxy group, an alkylthio group, an arylthio group, a hydrocarbon ring group, an aryl group, and a heterocyclic group. In addition, each of the substituents may be substituted or unsubstituted. For example, a biphenyl group may be interpreted as an aryl group or a phenyl group substituted with a phenyl group.

In the present description, the expression "forming a ring via the combination with an adjacent group" may mean forming a substituted or unsubstituted hydrocarbon ring, or a substituted or unsubstituted heterocycle via the combination with an adjacent group. The hydrocarbon ring may include an aliphatic hydrocarbon ring and/or an aromatic hydrocarbon ring. The heterocycle may include an aliphatic heterocycle and/or an aromatic heterocycle. The ring formed by the combination with an adjacent group may be a monocyclic ring and/or a polycyclic ring. In addition, the ring formed via the combination with each other may be combined with another ring to form a spiro structure.

In the present description, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

In the present description, the alkyl group may be linear, branched or cyclic. The carbon number of the alkyl group may be in a range of 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldodecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., without limitation.

In the present description, the term "aryl group" means an optional functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinqphenyl group, a sexiphenyl group, a triphenylenyl group, a pyrenyl group, a benzofluoranthenyl group, a chrysenyl group, etc., without limitation.

In the present description, the heteroaryl group may be a heteroaryl group including one or more of O, N, P, Si, or S as a heteroatom. When the heteroaryl group includes at least two hetero atoms, the at least two hetero atoms may be the same as or different from each other. The heteroaryl group may be a monocyclic heteroaryl group or polycyclic heteroaryl. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a thiazole group, an oxazole group, an oxadiazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline, indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isooxazole, an oxadiazole group, a thiadiazole group, a phenothiazine group, a dibenzosilole group, a dibenzofuran group, etc., without limitation.

In the present description, the term "direct linkage" may mean a single bond.

FIG. 1 is a cross-sectional view schematically illustrating an organic electroluminescence device according to an embodiment of the present disclosure. The organic electroluminescence device 10 according to the embodiment may include a first electrode EL1, a hole transport region HTR, an emission layer EML, an electron transport region ETR, and a second electrode EL2, which are sequentially laminated.

Figure 2:
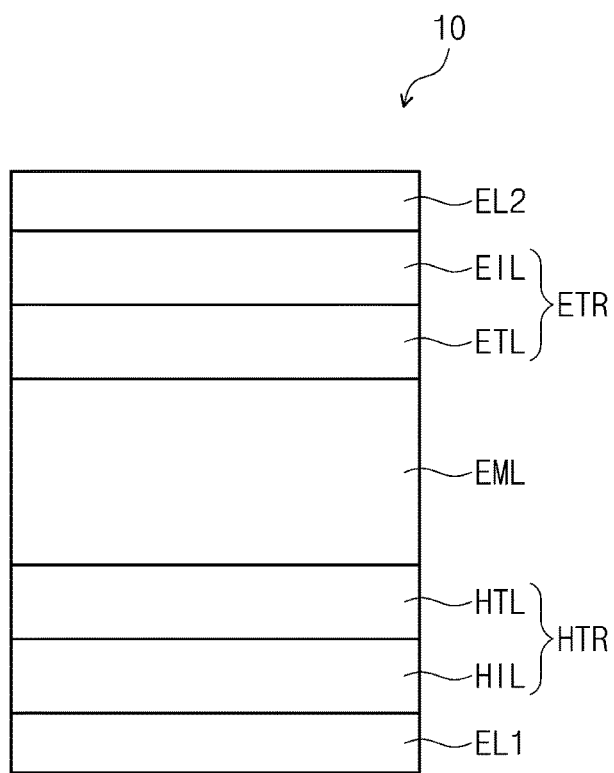
FIG. 2 is a cross-sectional view schematically illustrating an organic electroluminescence device according to an embodiment of the present disclosure.
Figure 3:
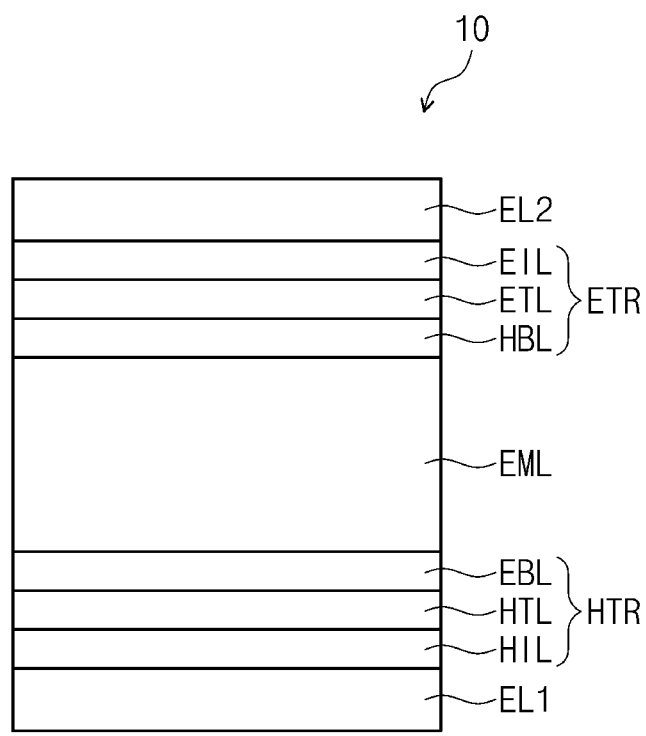
FIG. 3 is a cross-sectional view schematically illustrating an organic electroluminescence device according to an embodiment of the present disclosure.

Compared with FIG. 1, FIG. 2 illustrates a cross-sectional view of an organic electroluminescence device 10 according to an embodiment, wherein a hole transport region HTR includes a hole injection layer HIL and a hole transport layer HTL, and an electron transport region ETR includes an electron injection layer EIL and an electron transport layer ETL. In addition, compared with FIG. 1, FIG. 3 illustrates a cross-sectional view of an organic electroluminescence device 10 according to an embodiment, wherein a hole transport region HTR includes a hole injection layer HIL, a hole transport layer HTL and an electron blocking layer EBL, and an electron transport region ETR includes an electron injection layer EIL, an electron transport layer ETL and a hole blocking layer HBL.

At least one organic layer of the hole transport region HTR, the emission layer EML, and the electron transport region ETR may include a polycyclic compound represented by Formula 1-1 or Formula 1-2. Further explanation of the polycyclic compound represented by Formula 1-1 or Formula 1-2 will be provided herein below.

The first electrode EL1 may have conductivity (e.g., may be electrically conductive). The first electrode EL1 may be formed of a metal alloy or a conductive compound. The first electrode EL1 may be an anode. In addition, the first electrode EL1 may be a pixel electrode. The first electrode EL1 may be a transmissive electrode, a transflective electrode, or a reflective electrode. When the first electrode EL1 is a transmissive electrode, the first electrode EL1 may include a transparent metal oxide, for example, indium tin oxide (ITO), indium zinc oxide (IZO), zinc oxide (ZnO), or indium tin zinc oxide (ITZO), etc. When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound or a mixture thereof (for example, a mixture of Ag and Mg). In some embodiments, the first electrode EL1 may have a structure which has a plurality of layers including a reflective layer or a transflective layer formed of any of the described materials; and a transparent conductive layer formed of ITO, IZO, ZnO, or ITZO, etc. For example, the first electrode EL1 may have a three-layer structure of ITO/Ag/ITO, but the present disclosure is not limited thereto. A thickness of the first electrode EL1 may be about 300 to 10000 Å, for example, about 500 to 3000 Å.

The hole transport region HTR may be on the first electrode EL1. The hole transport region HTR may include at least one of a hole injection layer HIL, a hole transport layer HTL, a hole buffer layer, or an electron blocking layer EBL.

The hole transport region HTR may have a structure of: a single layer formed of a single material; a single layer formed of a plurality of different materials; or a multi-layer having a plurality of layers formed of a plurality of different materials.

For example, the hole transport region HTR may have a structure of a single layer which is a hole injection layer HIL or a hole transport layer HTL, or may have a structure of a single layer formed of a hole injection material and a hole transport material. In some embodiments, the hole transport region HTR may have a structure of a single layer formed of a plurality of different materials, or may have a structure of, sequentially laminated from the first electrode EL1, hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, but the present disclosure is not limited thereto.

The hole transport region HTR may be formed by using various suitable methods such as a vacuum deposition method, a spin coating method, a casting method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4'4"-tris(N,N-diphenylamino)triphenylamine (TDATA), 4,4',4"-tris[2-naphthyl(phenyl)amino]triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/Camphorsulfonic acid (PANI/CSA), polyaniline/poly(4-styrenesulfonate) (PANI/PSS), N,N'-di(1-naphthyl)-N,N'-diphenylbenzidine (NPB), triphenylamine-containing polyetherketone (TPA-PEK), 4-isopropyl-4'-methyldiphenyliodoniumtetrakis(pentafluorophenyl)borate, or dipyrazino[2,3f:2',3'-h]quinoxaline-2,3,6,7,10,11-hexacarbonitrile (HAT-CN), etc.

The hole transport layer HTL may further include, for example, a carbazole-based derivative (such as N-phenylcarbazole or polyvinylcarbazole), a fluorine-based derivative, a triphenylamine-based derivative (such as N,N'-bis(3-methylphenyl)-N,N'-diphenyl-(1,1-biphenyl)-4,4'-diamine (TPD) or 4,4',4"-tris(N-carbazolyl)triphenylamine (TCTA)), N,N'-di(1-naphthyl)-N,N'-diphenylbenzidine (NPB), 4,4'-cyclohexylidenebis[N,N-bis(4-methylphenyl)benzenamine] (TAPC), 4,4'-bis[N,N'-(3-tolyl)amino]-3,3'-dimethylbiphenyl (HMTPD), or 1,3-bis(N-carbazolyl)benzene (mCP), etc.

A thickness of the hole transport region HTR may be about 100 to 10000 Å, for example, about 100 to 5000 Å. A thickness of the hole injection layer HIL may be, for example, about 30 to 1000 Å, and a thickness of the hole transport layer HTL may be about 10 to 1000 Å. For example, a thickness of the electron blocking layer EBL may be about 10 to 1000 Å. When the thicknesses of the hole transport region HTR, the hole injection layer HIL, the hole transport layer HTL and the electron blocking layer EBL satisfy the described ranges, suitable or satisfactory hole transport performance may be achieved without substantial rise of a driving voltage.

The hole transport region HTR may further include a charge generating material in addition to the described materials to improve conductivity. The charge generating material may be uniformly or non-uniformly dispersed in the hole transport region HTR. The charge generating material may be, for example, a p-dopant. The p-dopant may be one of a quinone derivative, a metal oxide, or a cyano group-containing compound, but the present disclosure is not limited thereto. The non-limited examples of the p-dopant may be, for example, a quinone derivative (such as tetracyanoquinodimethane (TCNQ) or 2,3,5,6-tetrafluoro-tetracyanoquinodimethane (F4-TCNQ)) or a metal oxide (such as a tungsten oxide or a molybdenum oxide), etc., but the present disclosure is not limited thereto.

As described herein, the hole transport region HTR may further include at least one of the hole buffer layer and/or the electron blocking layer EBL in addition to the hole injection layer HIL and the hole transport layer HTL. The hole buffer layer may improve the light emission efficiency by compensating a resonance distance according to the wavelength of the light emitted from the emission layer EML. The materials included in the hole transport region HTR may also be used as materials included in the hole buffer layer. The electron blocking layer EBL may be a layer which prevents or reduces electron injection from the electron transport region ETR to the hole transport region HTR.

The emission layer EML may be on the hole transport region HTR. The emission layer EML may have a thickness of, for example, about 100 to 1000 Å or about 100 to 300 Å. The emission layer EML may have a structure of: a single layer formed of a single material; a single layer formed of a plurality of different materials; or a multi-layer having a plurality of layers formed of a plurality of different materials.

The emission layer EML may include a polycyclic compound represented by Formula 1-1 or Formula 1-2:

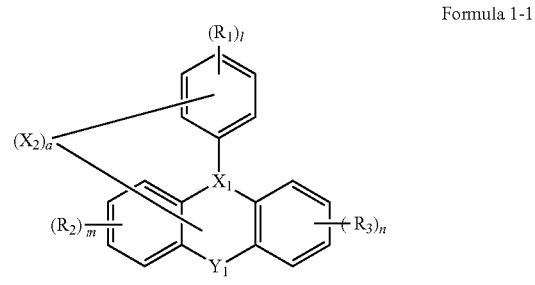

Formula 1-1

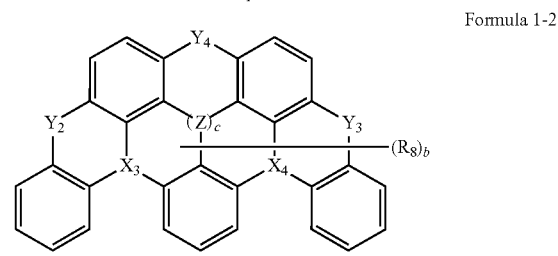

Formula 1-2

In Formula 1-1, $R_1$ to $R_3$ may each independently be a hydrogen atom, a deuterium atom, an alkyl group, an aryl group, or a heteroaryl group, or may be bonded to adjacent groups to form a condensed polycyclic ring. In the present description, the condensed polycyclic ring may contain: a substituted or unsubstituted condensed polycyclic ring; or a substituted or unsubstituted condensed hetero-polycyclic ring.

The alkyl group may be a substituted or unsubstituted alkyl group having 1 to 20 carbon atoms, and the aryl group may be a substituted or unsubstituted aryl group having 6 to 30 ring-forming carbon atoms, and the heteroaryl group may be substituted or unsubstituted heteroaryl group having 2 to 30 ring-forming carbon atoms. $R_1$ to $R_3$, for example, may each independently be bonded to a hydrogen atom or an adjacent group to form a condensed polycyclic ring.

The subscripts I to n may each independently be an integer of 0 to 4. For example, all of I to n may be 0, and at least one of I to n may be 1 or larger. When at least one of I to n is 1 or larger, at least one of $R_1$ to $R_3$ may not be a hydrogen atom.

When I to n are each independently 1 or larger, $R_1$ to $R_3$ may be the same as or different from each other.

When I is 2 or larger, a plurality of $R_1$ may be the same as or different from each other. The description of m and n is substantially the same as that for I as provided herein above, and therefore, a duplicative description thereof will not be repeated here.

Formula 1-1, for example, may be represented by Formula A1 or Formula A2:

Formula A1

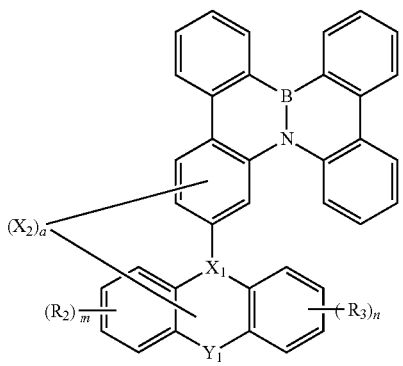

Formula A2

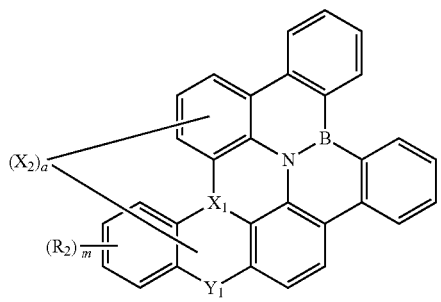

Formula A1 is a formula in which two $R_1$ of Formula 1-1 are bonded to each other to form an unsubstituted condensed hetero-pentacyclic ring having a B-N direct bond when I is 2. Formula A2 is a formula in which two $R_1$ and two $R_2$ of Formula 1-1 are bonded to each other to form an unsubstituted condensed hetero-tetracyclic ring having a B-N direct bond when I and n are 2, respectively. However, the present disclosure is not limited thereto, and $R_1$ to $R_3$ may combine with each other to form various suitable condensed polycyclic rings. For example, a substituted or unsubstituted condensed polycyclic ring having both an aromatic ring and a nonaromatic ring, or a substituted or unsubstituted condensed hetero-polycyclic ring having both an aromatic ring and a nonaromatic ring may be formed. In Formulae A1 and A2, pentacyclic and tetracyclic rings are formed respectively, but the present disclosure is not limited thereto. For example, a condensed polycyclic ring having two or more and less than ten rings may be formed. Hereinafter, the same description as the above description may be applied when the expression "forming a condensed polycyclic ring via the combination with an adjacent group" is described in the present specification.

$X_1$ may be B or N. For example, $X_1$ may be B.

$X_2$ may be $BR_{1-1}$ or $NR_{1-2}$. For example, $X_2$ may be $NR_{1-2}$.

$R_{1-1}$ and $R_{1-2}$ may each independently be a hydrogen atom, a deuterium atom, an alkyl group, an aryl group, or a heteroaryl group.

The alkyl group may be a substituted or unsubstituted alkyl group having 1 to 20 carbon atoms, and the aryl group may be a substituted or unsubstituted aryl group having 6 to 30 ring-forming carbon atoms, and the heteroaryl group may be substituted or unsubstituted heteroaryl group having 2 to 30 ring-forming carbon atoms. For example, $R_{1-1}$ and $R_{1-2}$ may be a substituted or unsubstituted aryl group, and for example, may be an unsubstituted phenyl group.

The subscript a may be 1 or 2. When a is 2, $X_2$ may be the same as or different from each other. For example, when a is 2, all of $X_2$ may be $NR_{1-2}$, and for example, all of $X_2$ may be a phenylamine group.

$Y_1$ may be O, S, $BR_4$, or $NR_5$. For example, $Y_1$ may be $NR_5$.

$R_4$ and $R_5$ may each independently be a hydrogen atom, a deuterium atom, an alkyl group, an aryl group, or a heteroaryl group, or may be bonded to adjacent groups to form a condensed polycyclic ring.

The alkyl group may be a substituted or unsubstituted alkyl group having 1 to 20 carbon atoms, and the aryl group may be a substituted or unsubstituted aryl group having 6 to 30 ring-forming carbon atoms, and the heteroaryl group may be substituted or unsubstituted heteroaryl group having 2 to 30 ring-forming carbon atoms. For example, $R_5$ may be a substituted or unsubstituted aryl group, and for example, may be an unsubstituted phenyl group. For example, $Y_1$ may be a phenylamine group.

At least one of $R_1$ to $R_5$ may be bonded to adjacent groups to form a condensed polycyclic ring having a B-N direct bond, or a heteroaryl group having a B-N direct bond. For example, $R_1$ may be bonded to at least one of $R_2$ to $R_5$, or $X_2$ to form a condensed polycyclic ring having a B-N direct bond. The description of $R_2$ to $R_5$ is substantially the same as that for $R_1$ as provided herein above, and therefore, a duplicative description thereof will not be repeated here.

In some embodiments, for example, when I is 2 or larger, $R_1$— may be bonded to each other to form a condensed polycyclic ring, or may be bonded to at least one of a plurality of $R_1$, $R_2$ to $R_5$, or $X_2$ to form a condensed polycyclic ring having a B-N direct bond. The description of n and m is substantially the same as that of I as provided herein above, and therefore, a duplicative description thereof will not be repeated here.

In some embodiments, at least one of $R_1$ to $R_3$ may be bonded to adjacent groups to form a condensed polycyclic ring having a B-N direct bond, or at least one of $R_4$ and $R_5$ may be a polycyclic heteroaryl group having a B-N direct bond.

Formula 1-1 may be represented by Formula 2-1-1 or Formula 2-1-2:

Formula 2-1-1

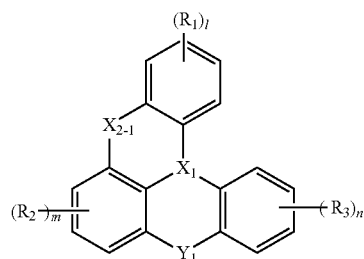

Formula 2-1-2

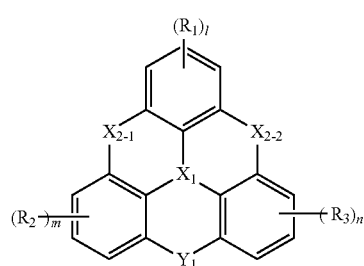

Formula 2-1-1 and Formula 2-1-2 are formulae in which substitution positions of a and X of Formula 1-1 are specifically defined. In Formula 2-1-1 and Formula 2-1-2, $X_{2-1}$ and $X_{2-2}$ may each independently be $BR_{1-1}$ or $NR_{1-2}$, and $R_1$ to $R_3$, l to n, $X_1$, $Y_1$, $R_{1-1}$, and $R_{1-2}$ may be the same as described with respect to Formula 1-1.

Formula 1-1 may be represented by Formula 3-1-1 or Formula 3-1-2:

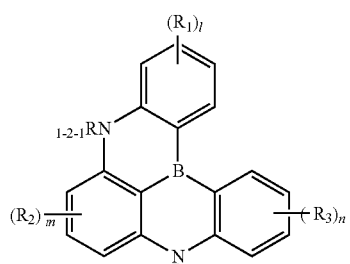

Formula 3-1-1

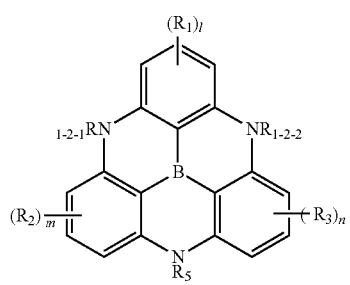

Formula 3-1-2

Formula 3-1-1 and Formula 3-1-2 are formulae in which substitution positions of $X_1$ and $X_2$, and a of Formula 1-1 are specifically defined. In Formula 3-1-1 and Formula 3-1-2, $R_{1-2-1}$ and $R_{1-2-2}$ may each independently be $R_{1-2}$, and $R_1$ to $R_3$, l to n, $R_{1-2}$, and $R_5$ may be the same as described with respect to Formula 1-1.

Formula 1-1 may be represented by Formula 4-1:

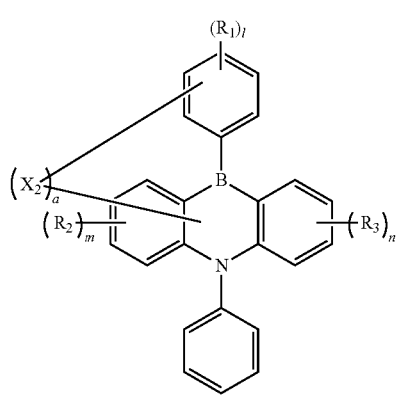

Formula 4-1

Formula 4-1 is a formula in which $X_1$ and $Y_1$ of Formula 1-1 are specifically defined. In Formula 4-1, $R_1$ to $R_3$, l to n, $X_2$, and a may be the same as described with respect to Formula 1-1.

In Formula 1-2, $X_3$ and $X_4$ may each independently be B or N. For example, both $X_3$ and $X_4$ may be B, or may be N, and either $X_3$ or $X_4$ may be B and the other may be N.

$Y_2$ to $Y_4$ may each independently be $BR_6$, $NR_7$, O, or S.

$R_6$ and $R_7$ may each independently be a hydrogen atom, a deuterium atom, an alkyl group, an aryl group, or a heteroaryl group. The alkyl group may be a substituted or unsubstituted alkyl group having 1 to 20 carbon atoms, and the aryl group may be a substituted or unsubstituted aryl group having 6 to 30 ring-forming carbon atoms, and the heteroaryl group may be a substituted or unsubstituted heteroaryl group having 2 to 30 ring-forming carbon atoms. For example, $R_6$ and $R_7$ may each independently be a substituted or unsubstituted aryl group. In some embodiments, $R_6$ and $R_7$ may each independently be an unsubstituted phenyl group.

One to four selected from $X_3$, $X_4$, and $Y_2$ to $Y_4$ may contain B. For example, two or three selected from $X_3$, $X_4$, and $Y_2$ to $Y_4$ may contain B. In this case, the other atoms may each independently contain N, O, or S. For example, two or three selected from $X_3$, $X_4$, and $Y_2$ to $Y_4$ may contain B and the others may contain N, or two or three selected from $X_3$, $X_4$, and $Y_2$ to $Y_4$ may contain B and the others may contain O, or two or three selected from $X_3$, $X_4$, and $Y_2$ to $Y_4$ may contain B and the others may contain S.

$R_8$ may be a hydrogen atom, a deuterium atom, an alkyl group, an aryl group, or a heteroaryl group. The alkyl group may be a substituted or unsubstituted alkyl group having 1 to 20 carbon atoms, and the aryl group may be a substituted or unsubstituted aryl group having 6 to 30 ring-forming carbon atoms, and the heteroaryl group may be a substituted or unsubstituted heteroaryl group having 2 to 30 ring-forming carbon atoms. For example, $R_8$ may be hydrogen.

The subscript b may be an integer of 0 to 15. When b is 1 or larger, $R_8$ may not be hydrogen. When b is 2 or larger, a plurality of $R_8$ may be the same as or different from each other.

Z may be B or N. The subscript c may be 0 or 1.

On the other hand, in the present description, " " may mean a selective bond. In Formula 1-2, for example, when c is 0, it may mean that the bonds are omitted, and when c is 1, it may mean that the bonds are connected to Z linked by a direct linkage or a single bond.

Formula 1-2 may be represented by Formulae 2-2-1 to 2-2-3:

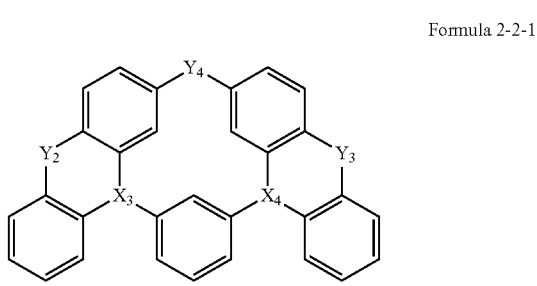

Formula 2-2-1

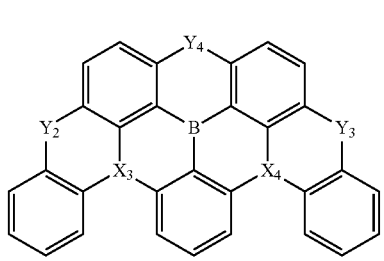

Formula 2-2-2

-continued

Formula 2-2-3

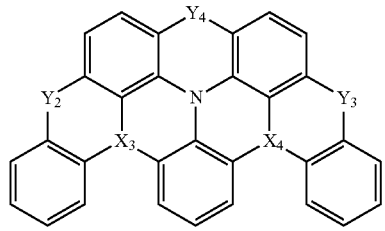

Formulae 2-2-1 to 2-2-3 are formulae in which $R_8$, b, Z, and c of Formula 1-2 are specifically defined. Formula 2-2-1 is a formula in which b and c of Formula 1-2 are 0. Formula 2-2-2 is a formula in which b, c, and Z of Formula 1-2 are 0, 1, and B, respectively. Formula 2-2-3 is a formula in which b, c, and Z of Formula 1-2 are 0, 1, and N, respectively. In Formulae 2-2-1 to 2-2-3, $X_3$, $X_4$, and $Y_2$ to $Y_4$ may be the same as described with respect to Formula 1-2. In the specification, the statement "b is 0" may have substantially the same meaning that b is 1 or larger and a plurality of $R_8$ are all hydrogen.

The polycyclic compound of an embodiment may be any one of the compounds shown in Compound Group 1:

Compound Group 1

TA-01

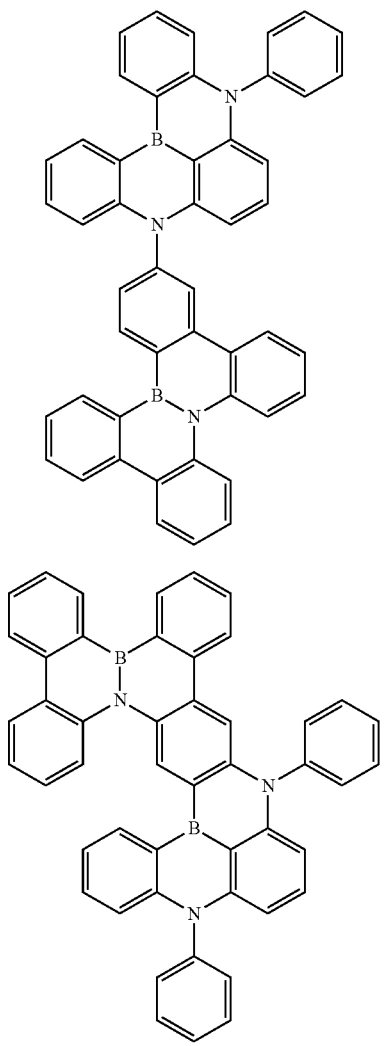

TA-02

TA-03

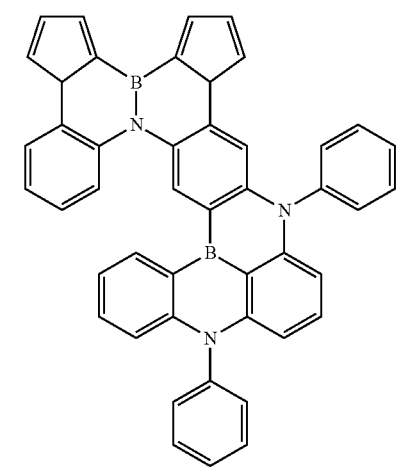

TA-04

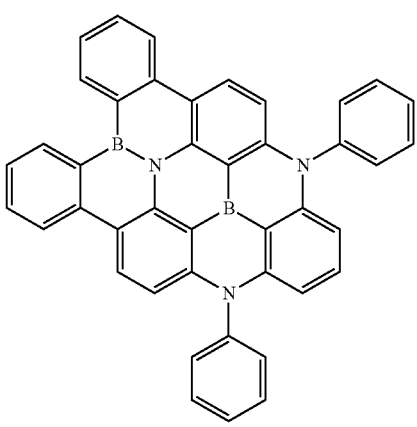

TA-05

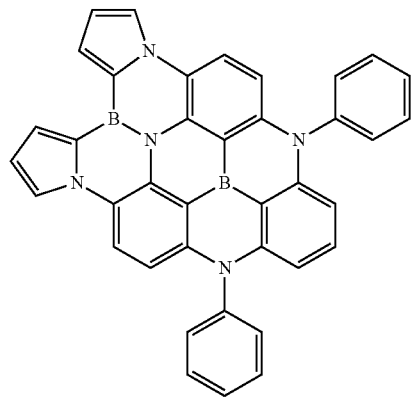

TA-06

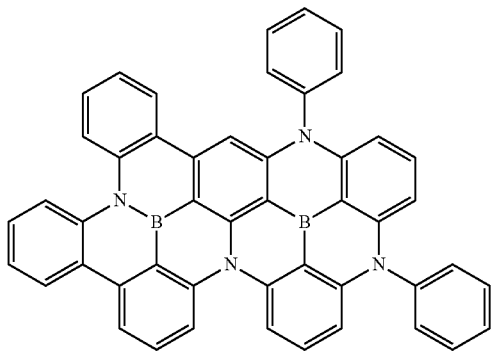

TA-07
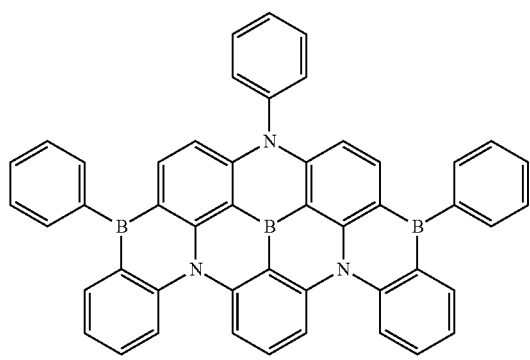
TA-08
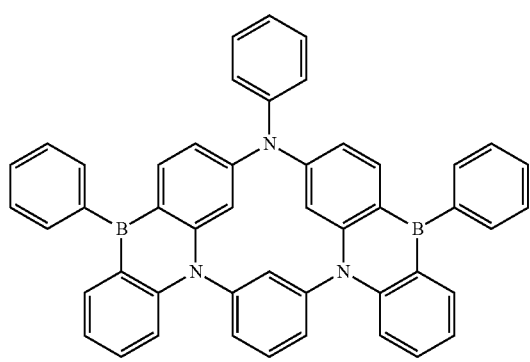
TA-09
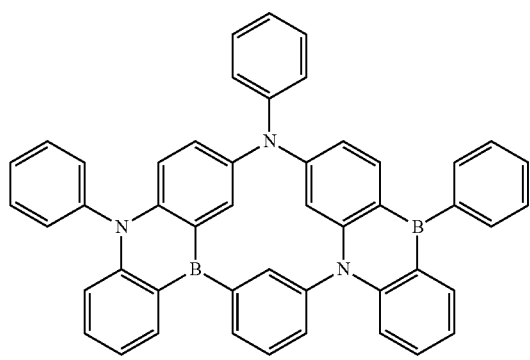
TA-10
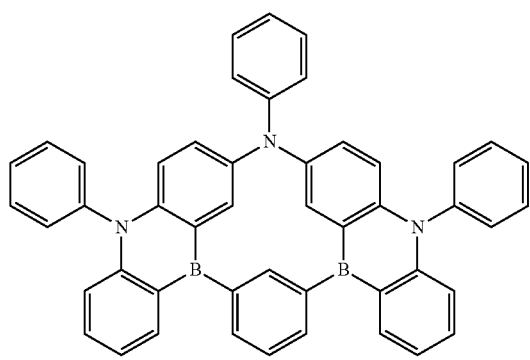
TA-11
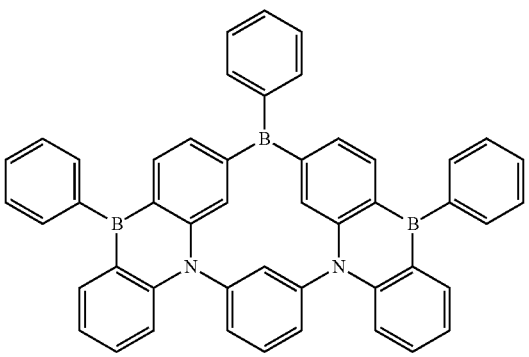
TA-12
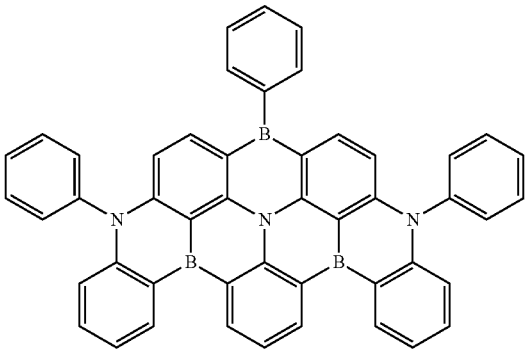
TA-13
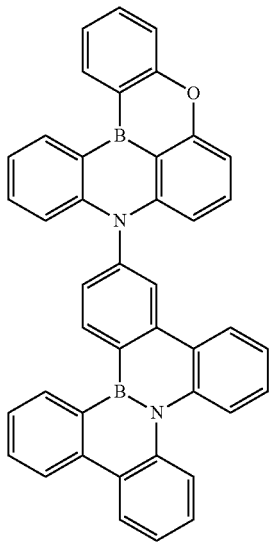

TA-14
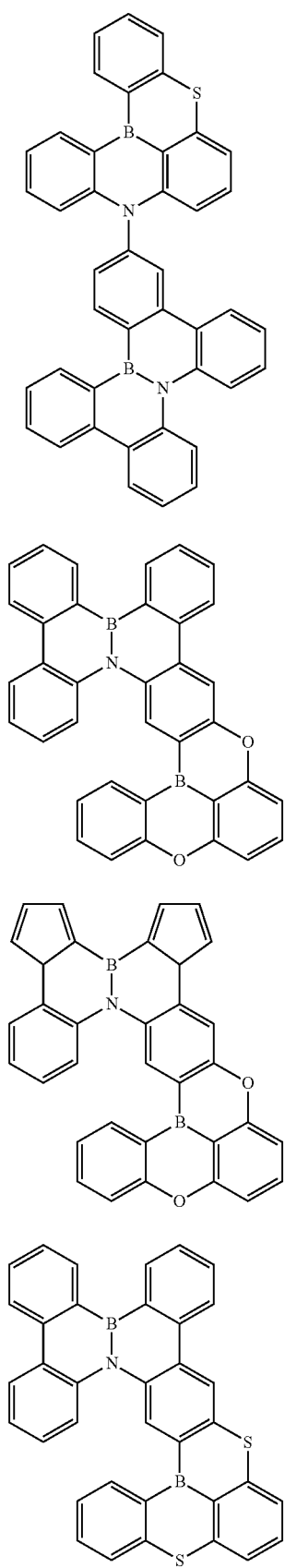
TA-18
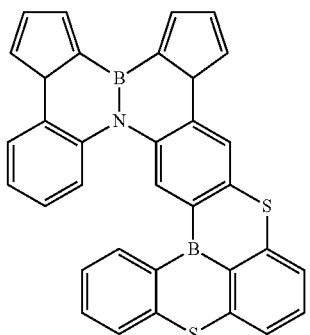
TA-15
TA-19
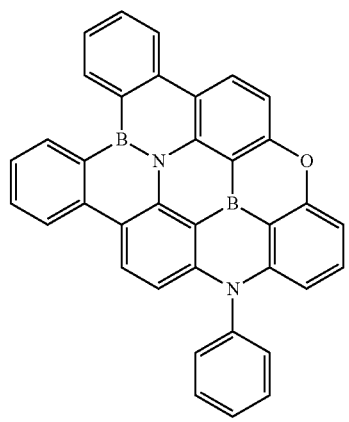
TA-16
TA-20
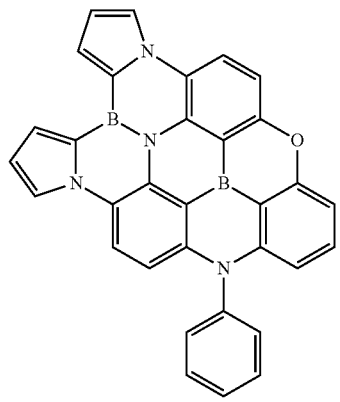
TA-17
TA-21
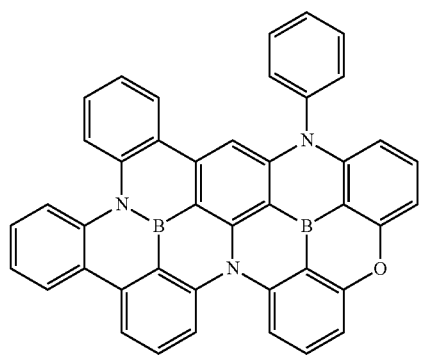

TA-22
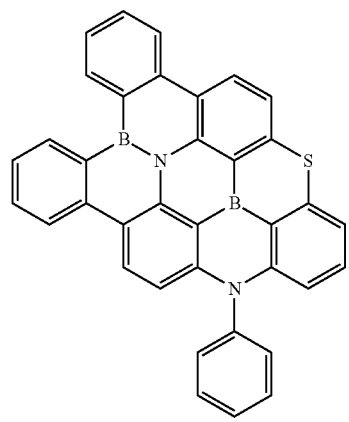
TA-23
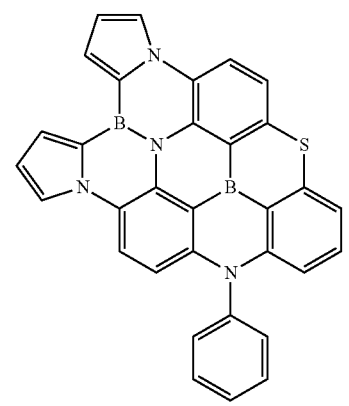
TA-24
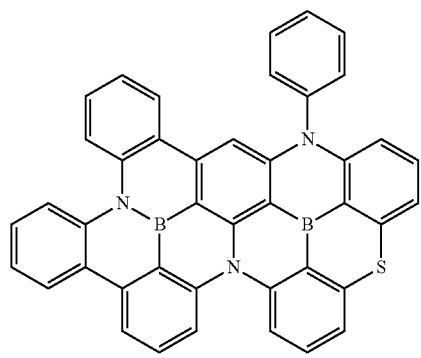
TA-25
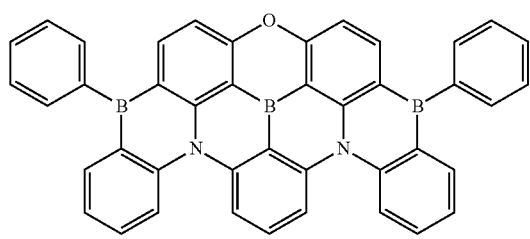
TA-26
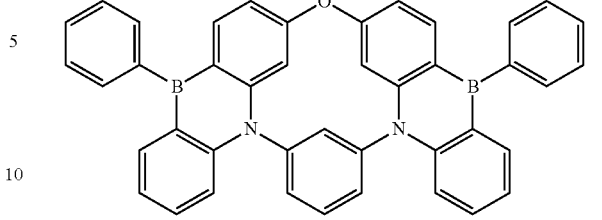
TA-27
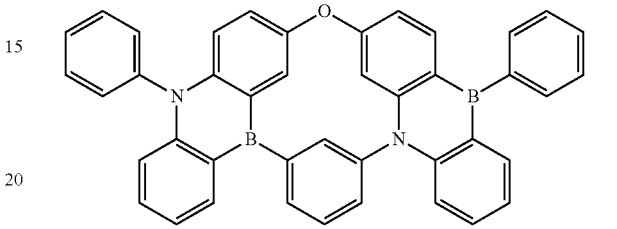
TA-28
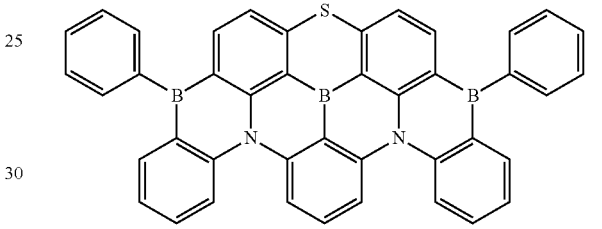
TA-29
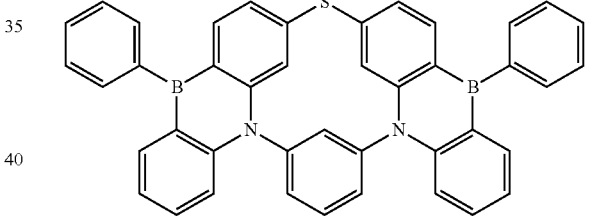
TA-30
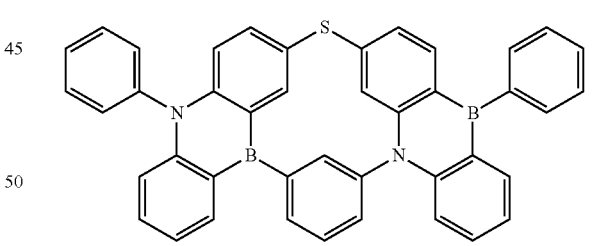
TA-31
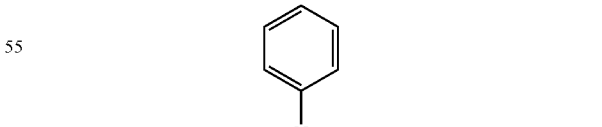
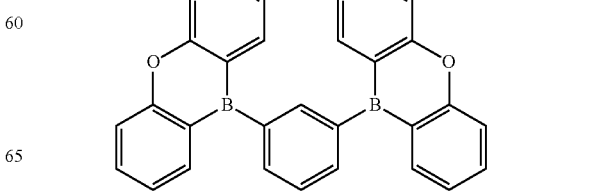

-continued

TA-32
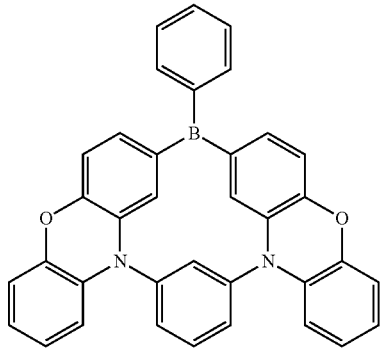

TA-33
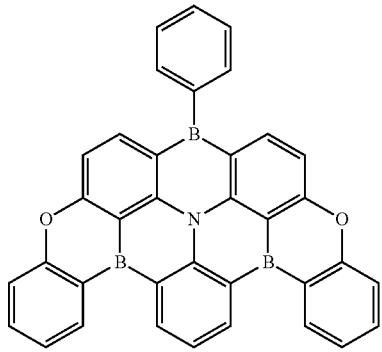

TA-34
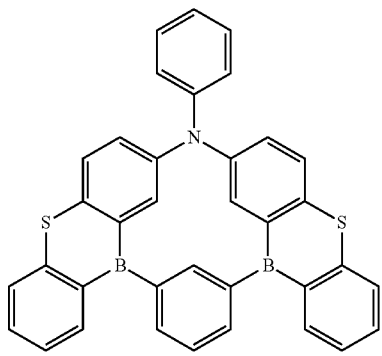

TA-35
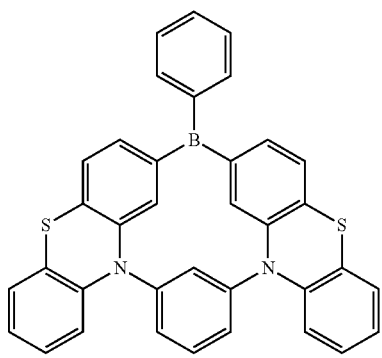

-continued

TA-36
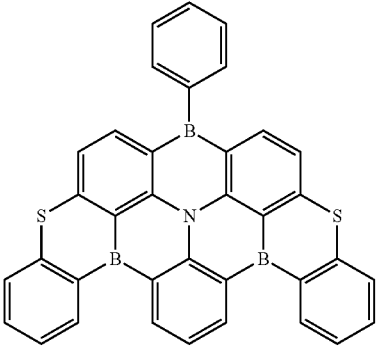

The emission layer EML may include one or two or more polycyclic compounds of an embodiment. The emission layer EML may further include any suitable material available in the art in addition to the polycyclic compounds described herein.

The emission layer EML may include a host and a dopant, and the dopant may contain a polycyclic compound. The polycyclic compounds represented by Formula 1-1 and Formula 1-2 may be included in the emission layer EML as a dopant. The polycyclic compounds represented by Formula 1-1 and Formula 1-2 may be included in the emission layer EML as a thermally activated delayed fluorescent dopant.

The emission layer EML may emit any one of red light, green light, or blue light by including a polycyclic compound of an embodiment. For example, the emission layer EML may be a blue-emission layer configured to emit blue light having a wavelength range of about 490 nm or less. In some embodiments, the polycyclic compound may be included in the emission layer EML as a blue light dopant configured to emit light having a wavelength range of about 440 to 490 nm or about 465 to 475 nm.

The emission layer EML may include a host and a dopant, and may include any suitable material available in the art as a host material without limitation. For example, at least one of bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4''-tris(carbazol-9-yl)-triphenylamine (TcTa), or 1,3,5-tris(1-phenyl-1H-benzo[d]imidazol-2-yl)phenyl (TPBi) may be included. However, the present disclosure is not limited thereto, for example, tris(8-hydroxyquinolino)aluminum ($Alq_3$), 4,4'-bis(N-carbazolyl)-1,1'-biphenyl (CBP), poly(n-vinylcarbazole) (PVK), 9,10-di(naphthalene-2-yl)anthracene (ADN), 4,4',4''-tris(carbazol-9-yl)-triphenylamine (TCTA), 1,3,5-tris(1-phenyl-1H-benzo[d]imidazol-2-yl)phenyl (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl] ether oxide (DPEPO), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), or 2,8-bis(diphenylphosphoryl)dibenzofuran (PPF), etc. may be used as the host material.

The emission layer EML, for example, may further include at least one of N,N,N',N'-tetraphenyl-pyrene-1,6-diamine (TPD), 4,4'-bis[2-(9-ethyl-9H-carbazol-3-yl)vinyl]-1,1'-biphenyl; 4,4'-bis(9-ethyl-3-carbazovinylene)-1,1'-biphenyl (BCzVBi), 10-phenyl-10H,10'H-spiro[acridine-9,9'-anthracene]-10'-one (ACRSA), 3,4,5,6-tetra-9H-carbazol-9-yl-1,2-benzenedicarbonitrile (4CzPN), 2,4,5,6-Tetra-9H-carbazol-9-yl-isophthalonitrile (4CzIPN), bis[4-(9,9-dimethyl-9,10-dihydroacridine)phenyl]sulfone (DMAC-DPS), or 2-phenoxazine-4,6-diphenyl-1,3,5-triazine (PSZ-TRZ) as a dopant. In addition, the emission layer EML may further include styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), or N-(4-((E)-2-(6-((E)-4-(diphenylamino)styryl)naphthalen-2-yl)vinyl)phenyl)-N-phenylbenzenamine (N-BDAVBi)), perylene and derivatives thereof (for example, 2,5,8,11-tetra-t-butylperylene (TBP)), or pyrene and derivatives thereof (for example, 1,1-dipyrene, 1,4-dipyrenylbenzene, or 1,4-bis(N,N-diphenylamino)pyrene), etc. as a suitable dopant material.

The emission layer EML may be a blue-emission layer configured to emit blue light. The emission layer EML may be a fluorescent emission layer configured to emit fluorescent light. The emission layer EML may be a delayed fluorescent emission layer configured to emit delayed fluorescent light. For example, the emission layer EML may be a thermally activated delayed fluorescent emission layer configured to emit thermally activated delayed fluorescent light.

In the organic electroluminescence device 10 of an embodiment illustrated in FIGS. 1-3, the electron transport region ETR is on the emission layer EML. The electron transport region ETR may include at least one of a hole blocking layer HBL, an electron transport layer ETL, or an electron injection layer EIL, but the present disclosure is not limited thereto.

The electron transport region ETR may have a structure of: a single layer formed of a single material; a single layer formed of a plurality of different materials; or a multi-layer having a plurality of layers formed of a plurality of different materials.

For example, the electron transport region ETR may have a structure of a single layer which is an electron injection layer EIL or an electron transport layer ETL, or may have a structure of a single layer formed of an electron injection material and an electron transport material. In some embodiments, the electron transport region ETR may have a structure of a single layer formed of a plurality of different materials, or may have a structure of, sequentially laminated from the emission layer EML, electron transport layer ETL/electron injection layer EIL or hole blocking layer HBL/electron transport layer ETL/electron injection layer EIL, but the present disclosure is not limited thereto. A thickness of the electron transport region ETR may be, for example, in a range of about 1000 to 1500 Å.

The electron transport region ETR may be formed using various suitable methods such as a vacuum deposition method, a spin coating method, a casting method, a Langmuir-Blodgett (LB) method, an inkjet printing method, a laser printing method, or a laser induced thermal imaging (LITI) method.

When the electron transport region ETR includes the electron transport layer ETL, the electron transport region ETR may include an anthracene-based compound.

However the present disclosure is not limited thereto, and the electron transport region ETR may include, for example, tris(8-hydroxyquinolinato)aluminum (Alq$_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tris(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq$_2$), 9,10-di(naphthalene-2-yl) anthracene (ADN), or a mixture thereof. A thickness of the electron transport layer ETL may be about 100 to 1000 Å, for example, about 150 to 500 Å. When the thickness of the electron transport layer ETL satisfies the described range, suitable or satisfactory electron transport performance may be achieved without substantial rise of a driving voltage.

When the electron transport region ETR includes the electron injection layer EIL, the electron transport region ETR may use a lanthanide metal such as Yb; halogenated metal such as RbCl, RbI, LiF, NaCl, and CsF; metal oxide such as Li$_2$O, BaO; or lithium quinolate (LiQ), etc., but the present disclosure is not limited thereto. The electron injection layer EIL may also be formed of a mixture of an electron transport material and an insulating organo-metal salt. The organo-metal salt may be a material having an energy band gap of about 4 eV or more. For example, the organo-metal salt may contain, for example, a metal acetate, a metal benzoate, a metal acetoacetate, a metal acetylacetonate, or a metal stearate. A thickness of the electron injection layer EIL may be about 1-100 Å, or about 3-90 Å. When the thickness of the electron injection layer EIL satisfies the described range, suitable or satisfactory electron injection performance may be achieved without substantial rise of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP) or 4,7-diphenyl-1,10-phenanthroline (Bphen), but the present disclosure is not limited thereto.

The second electrode EL2 is on the electron transport region ETR. The second electrode EL2 may be a common electrode or a negative electrode. The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), and/or indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound or a mixture thereof (for example, a mixture of Ag and Mg). In some embodiments, the second electrode EL2 may be a structure which has a plurality of layers including a reflective layer or a transflective layer formed of the described materials; and a transparent conductive layer formed of ITO, IZO, ZnO, or ITZO, etc.

In some embodiments, the second electrode EL2 may be coupled to an auxiliary electrode. When the second electrode EL2 is coupled to the auxiliary electrode, the resistance of the second electrode EL2 may be reduced.

In some embodiments, a capping layer may be further on the second electrode EL2 of the organic electroluminescence device 10 of an embodiment. The capping layer may include, for example, α-NPD, NPB, TPD, m-MTDATA, Alq$_3$, CuPc, N4,N4,N4',N4'-tetra(biphenyl-4-yl)biphenyl-4, 4'-diamine (TPD15), 4,4',4"-Tris(carbazol-9-yl)-triphenylamine(TCTA), and/or N,N'-bis(naphthalene-1-yl), etc.

The polycyclic compound of an embodiment described above may be included as a material for the organic electroluminescence device 10 in the organic layer in addition to the emission layer EML. The organic electroluminescence device 10 according to an embodiment of the present disclosure may include the polycyclic compound in at least one organic layer between the first electrode EL1 and the second electrode EL2, and/or in a capping layer on the second electrode EL2.

In the organic electroluminescence device 10, as a voltage is applied to the first electrode EL1 and the second electrode EL2 respectively, the holes injected from the first electrode EL1 may move through the hole transport region HTR to the emission layer EML, and the electrons injected from the second electrode EL2 may move through the electron transport region ETR to the emission layer EML. The electrons and the holes may be recombined in the emission layer EML to generate excitons, and the excitons may emit light when the excitons fall back (e.g., transition or relax) from an excited state to a ground state.

According to an embodiment of the present disclosure, the organic electroluminescence device 10 having a low driving voltage and high efficiency may be achieved.

According to an embodiment of the present disclosure, the polycyclic compound may be applied to an organic electroluminescence device to contribute to lowering of a driving voltage and improving of efficiency.

According to an embodiment of the present disclosure, the polycyclic compound may have a difference between a singlet energy level and a triplet energy level of 0.03 eV or less or 0.025 eV or less, and thus the polycyclic compound may be used as a thermally activated delayed fluorescent material. According to an embodiment of the present disclosure, the polycyclic compound may be applied as a material for an organic electroluminescence device, thereby contributing to improving of efficiency.

Hereinafter, a polycyclic compound according to an embodiment of the present disclosure and an organic electroluminescence device of an embodiment including the polycyclic compound of an embodiment will be explained in more detail with reference to examples and comparative examples. In addition, the following embodiments are only examples to assist the understanding of the present disclosure, and the scope of the present disclosure is not limited thereto.

Synthesis Example

The polycyclic compound according to an embodiment of the present disclosure may be synthesized, for example, as described in the following examples. However, the synthesis method of the polycyclic compound according to an embodiment of the present disclosure is not limited thereto.

1-1. Synthesis of Compound TA-01

A polycyclic compound TA-01 according to an embodiment of the present disclosure may be synthesized, for example, by following Reaction 1:

Reaction 1

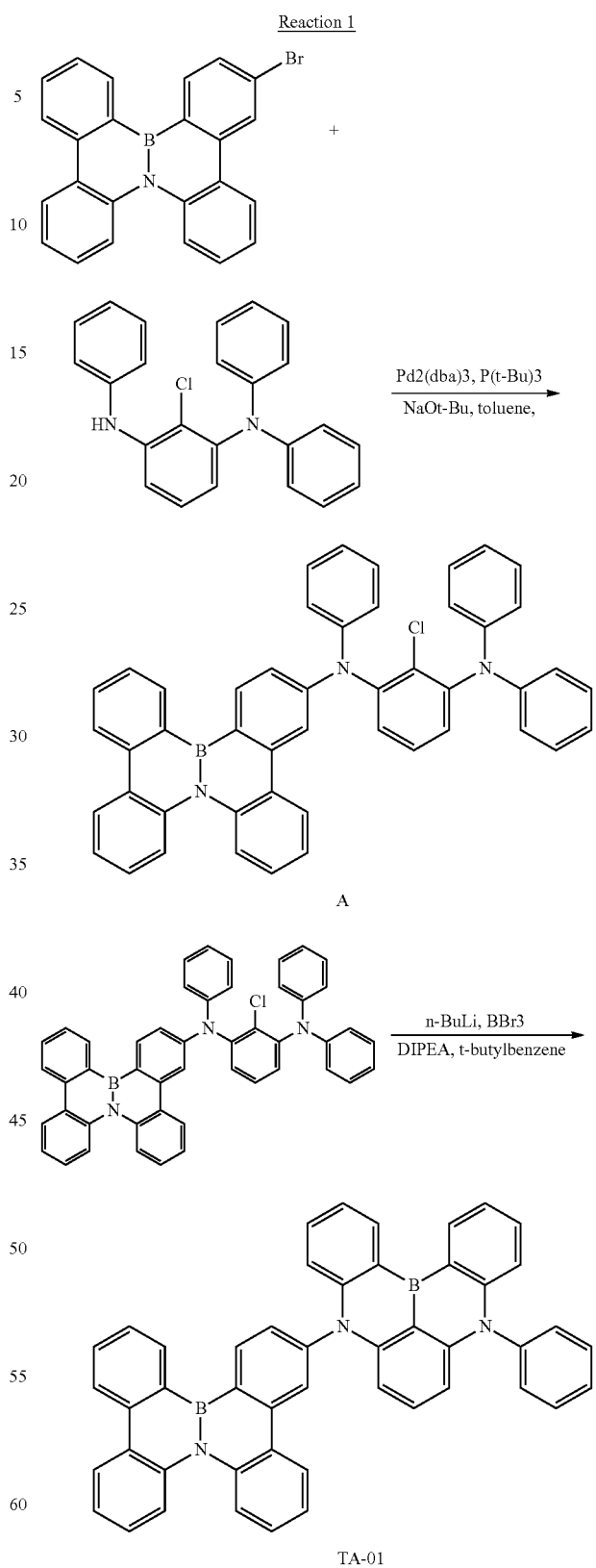

Synthesis of Intermediate A

Pd$_2$(dba)$_3$ (0.03 eq), (t-Bu)$_3$P (0.06 eq), NaOt-Bu(1 eq), and toluene (0.1 M based on 1 eq reagent) were added to a flask containing 2-chloro-N1,N1,N3-triphenylbenzene-1,3-diamine (1 eq) and 11-bromodibenzo[c,e]dibenzo[3,4:5,6][1,2]azaborinino[1,2-a][1,2]azaborinine (1.2 eq), and the mixture was refluxed and stirred for 5 hours. Thereafter, the mixture was cooled to room temperature, and extracted with MC (methylene chloride), and washed with distilled water. The extracted solution was dried over MgSO$_4$, and distilled under reduced pressure, and then the residue was separated by column chromatography to obtain an intermediate A (yield of 77.64%). An [M]+ value of the intermediate A, as measured by a high-resolution mass spectrometer, was 697.

Synthesis of Compound TA-01

T-butylbenzene (0.1 M based on 1 eq reagent) was added to the flask containing the intermediate A (1 eq), and the mixture was cooled to −78° C. After 1 hour, n-BuLi (1.2 eq) was added, and the mixture was warmed to room temperature. Thereafter, BBr$_3$ (1.2 eq) and N,N-diisopropylethylamine (DIPEA) (2 eq) were added thereto, and the resultant mixture was stirred at room temperature for 13 hours, and heated to 50° C., and stirred for 5 hours. Thereafter, the mixture was cooled to room temperature, and extracted with MC, and washed with distilled water. The extracted solution was dried over MgSO$_4$, and distilled under reduced pressure, and then the residue was separated by column chromatography to obtain a compound TA-01 (yield of 37.45%). An [M]+ value of the compound TA-01, as measured by a high-resolution mass spectrometer, was 670.

1-2. Synthesis of Compound TA-03

A polycyclic compound TA-03 according to an embodiment of the present disclosure may be synthesized, for example, by following Reaction 2:

Reaction 2

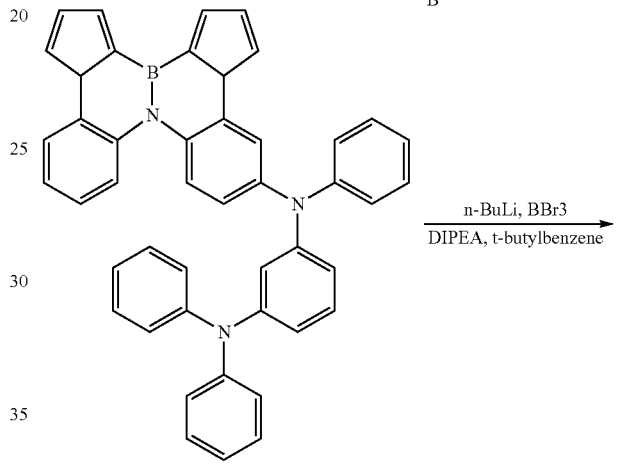

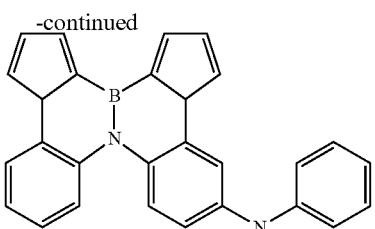

B

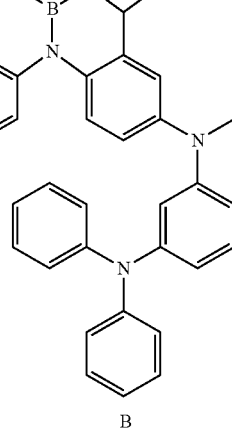

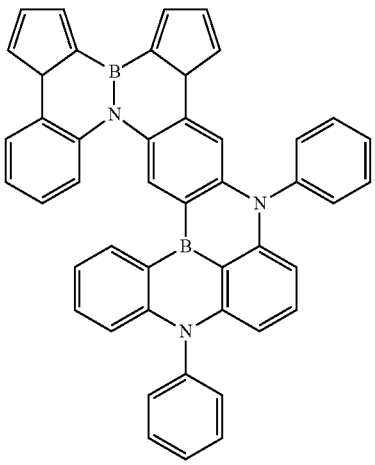

TA-03

Synthesis of Intermediate B

Pd$_2$(dba)$_3$ (0.03 eq), (t-Bu)$_3$P (0.06 eq), NaOt-Bu(1 eq), and toluene (0.1 M based on 1 eq reagent) were added to a flask containing N1,N1,N3-triphenylbenzene-1,3-diamine (1 eq) and 9-bromo-7aH,16bH-benzo[e]benzo[5,6]cyclopenta[3,4][1,2]azaborinino[1,2-a]cyclopenta[c][1,2]azaborinine (1.2 eq), and the mixture was refluxed and stirred for 5 hours. Thereafter, the mixture was cooled to room temperature, and extracted with MC, and washed with distilled water. The extracted solution was dried over MgSO$_4$, and distilled under reduced pressure, and then the residue was separated by column chromatography to obtain an intermediate B (yield of 81%). An [M]+ value of the intermediate B, as measured by a high-resolution mass spectrometer, was 638.

Synthesis of Compound TA-03

T-butylbenzene (0.1 M based on 1 eq reagent) was added to the flask containing the intermediate B (1 eq), and the mixture was cooled to −78° C. After 1 hour, n-BuLi (1.2 eq) was added, and the mixture was warmed to room temperature. Thereafter, BBr$_3$ (1.2 eq) and DIPEA (2 eq) were added thereto, and the resultant mixture was stirred at room temperature for 13 hours, and heated to 50° C., and additionally stirred for 5 hours. Thereafter, the mixture was cooled to room temperature, and extracted with MC, and washed with distilled water. The extracted solution was dried over MgSO$_4$, and distilled under reduced pressure, and then the residue was separated by column chromatography to obtain a compound TA-03 (yield of 43.2%). An [M]+ value of the compound TA-03, as measured by a high-resolution mass spectrometer, was 646.

1-3. Synthesis of Compound TA-04

A polycyclic compound TA-04 according to an embodiment of the present disclosure may be synthesized, for example, by following Reaction 3:

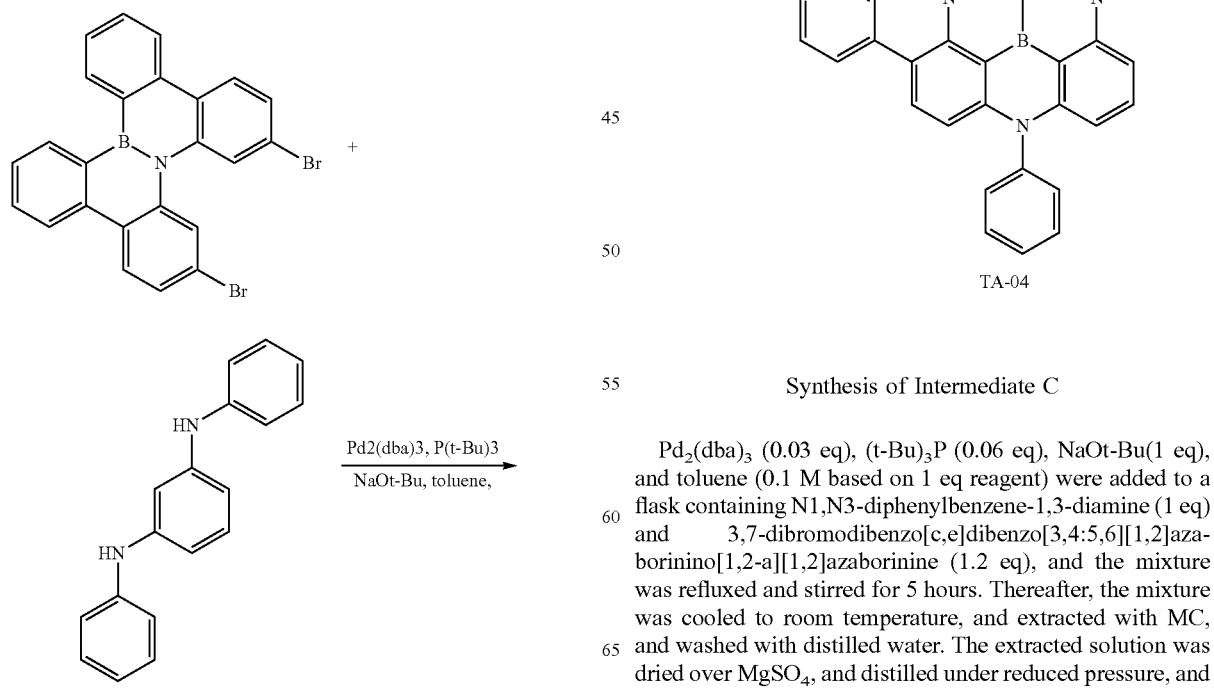

Synthesis of Intermediate C

Pd$_2$(dba)$_3$ (0.03 eq), (t-Bu)$_3$P (0.06 eq), NaOt-Bu(1 eq), and toluene (0.1 M based on 1 eq reagent) were added to a flask containing N1,N3-diphenylbenzene-1,3-diamine (1 eq) and 3,7-dibromodibenzo[c,e]dibenzo[3,4:5,6][1,2]azaborinino[1,2-a][1,2]azaborinine (1.2 eq), and the mixture was refluxed and stirred for 5 hours. Thereafter, the mixture was cooled to room temperature, and extracted with MC, and washed with distilled water. The extracted solution was dried over MgSO$_4$, and distilled under reduced pressure, and then the residue was separated by column chromatography to obtain an intermediate C (yield of 57%). An [M]+ value of the intermediate C, as measured by a high-resolution mass spectrometer, was 584.

Synthesis of Compound TA-04

T-butylbenzene (0.1 M based on 1 eq reagent) was added to the flask containing the intermediate C (1 eq), and the mixture was cooled to −78° C. After 1 hour, n-BuLi (1.2 eq) was added, and the mixture was warmed to room temperature. Thereafter, BBr$_3$ (1.2 eq) and DIPEA (2 eq) were added thereto, and the resultant mixture was stirred at room temperature for 13 hours, and heated to 50° C., and additionally stirred for 5 hours. Thereafter, the mixture was cooled to room temperature, and extracted with MC, and washed with distilled water. The extracted solution was dried over MgSO$_4$, and distilled under reduced pressure, and then the residue was separated by column chromatography to obtain a compound TA-04 (yield of 23.8%). An [M]+ value of the compound TA-04, as measured by a high-resolution mass spectrometer, was 592.

1-4. Synthesis of Compounds TA-08 and TA-07

Polycyclic compounds TA-08 and TA-07 according to an embodiment of the present disclosure may be synthesized, for example, by following Reaction 4:

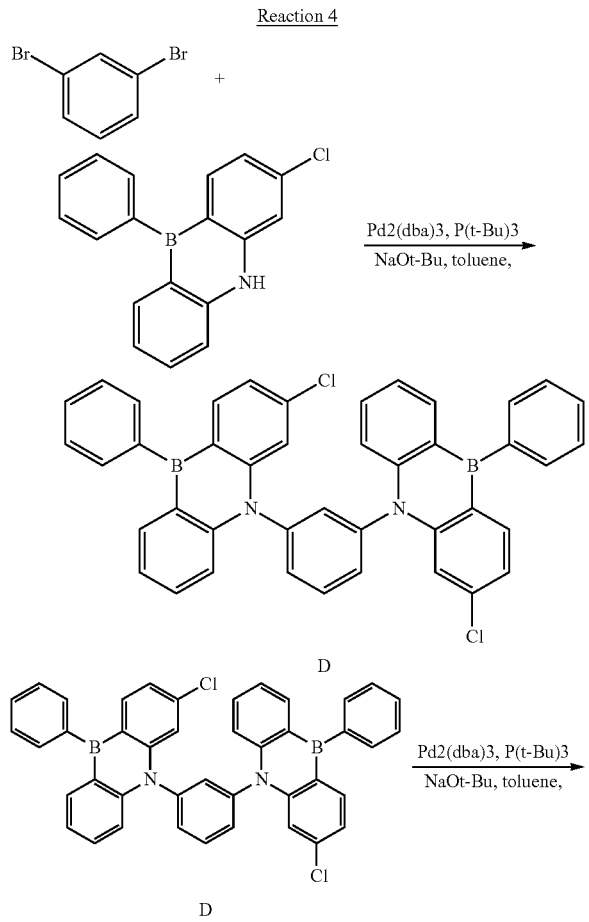

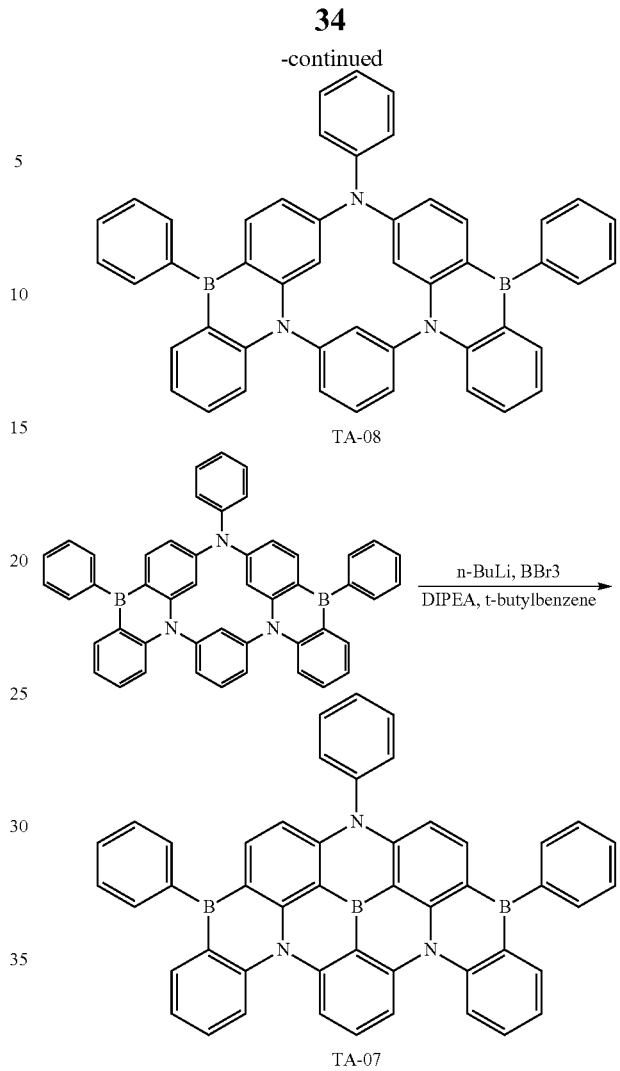

Synthesis of Intermediate D

Pd$_2$(dba)$_3$ (0.03 eq), (t-Bu)$_3$P (0.06 eq), NaOt-Bu(1 eq), and toluene (0.1 M based on 1 eq reagent) were added to a flask containing 1,3-dibromobenzene (1 eq) and 3-chloro-10-phenyl-5,10-dihydrodibenzo[b,e][1,4]azaborinine (2.1 eq), and the mixture was refluxed and stirred for 5 hours. Thereafter, the mixture was cooled to room temperature, and extracted with MC, and washed with distilled water. The extracted solution was dried over MgSO$_4$, and distilled under reduced pressure, and then the residue was separated by column chromatography to obtain an intermediate D (yield of 63%). An [M]+ value of the intermediate D, as measured by a high-resolution mass spectrometer, was 652.

Synthesis of Compound TA-08

Pd$_2$(dba)$_3$ (0.03 eq), (t-Bu)$_3$P (0.06 eq), NaOt-Bu(1 eq), and toluene (0.1 M based on 1 eq reagent) were added to a flask containing aniline (1 eq) and the intermediate D (1.2 eq), and the mixture was refluxed and stirred for 5 hours. Thereafter, the mixture was cooled to room temperature, and extracted with MC, and washed with distilled water. The extracted solution was dried over MgSO$_4$, and distilled under reduced pressure, and then the residue was separated by column chromatography to obtain a compound TA-08

(yield of 37%). An [M]₊ value of the compound TA-08, as measured by a high-resolution mass spectrometer, was 672.

Synthesis of Compound TA-07

T-butylbenzene (0.1 M based on 1 eq reagent) was added to the flask containing the compound TA-08 (1 eq), and the mixture was cooled to −78° C. After 1 hour, n-BuLi (1.2 eq) was added, and the mixture was warmed to room temperature. Thereafter, BBr₃ (1.2 eq) and DIPEA (2 eq) were added thereto, and the resultant mixture was stirred at room temperature for 13 hours, and heated to 50° C., and additionally stirred for 5 hours. Thereafter, the mixture was cooled to room temperature, and extracted with MC, and washed with distilled water. The extracted solution was dried over MgSO₄, and distilled under reduced pressure, and then the residue was separated by column chromatography to obtain a compound TA-07 (yield of 38.7%). An [M]+ value of the compound TA-07, as measured by a high-resolution mass spectrometer, was 680.

1-6. Synthesis of Compound TA-11

A polycyclic compound TA-11 according to an embodiment of the present disclosure may be synthesized, for example, by following Reaction 5:

Reaction 5

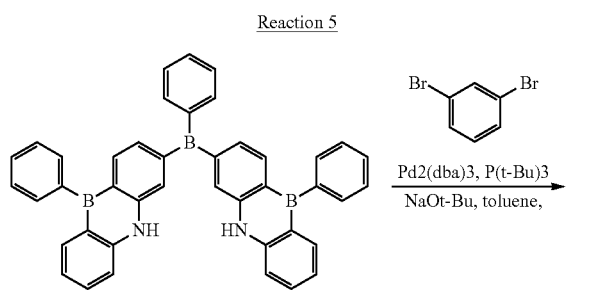

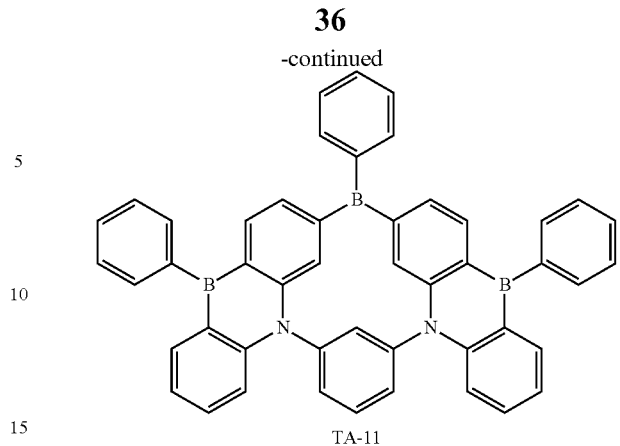

TA-11

Synthesis of compound TA-11

Pd₂(dba)₃ (0.03 eq), (t-Bu)₃P (0.06 eq), NaOt-Bu(1 eq), and toluene (0.1 M based on 1 eq reagent) were added to a flask containing 1,3-dibromobenzene (1 eq) and 3,3'-(phenylboranediyl)bis(10-phenyl-5,10-dihydrodibenzo[b,e][1,4]azaborinine) (1.2 eq), and the mixture was refluxed and stirred for 5 hours. Thereafter, the mixture was cooled to room temperature, and extracted with MC, and washed with distilled water. The extracted solution was dried over MgSO₄, and distilled under reduced pressure, and then the residue was separated by column chromatography to obtain a compound TA-11 (yield of 37%). An [M]+ value of the compound TA-11, as measured by a high-resolution mass spectrometer, was 669.

1-7. Synthesis of Compound TA-26

A polycyclic compound TA-26 according to an embodiment of the present disclosure may be synthesized, for example, by following Reaction 6:

Reaction 6

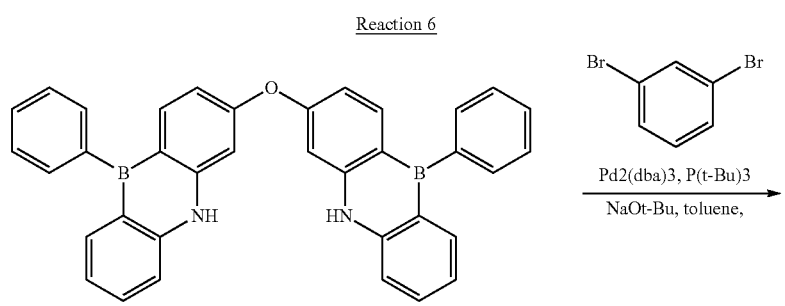

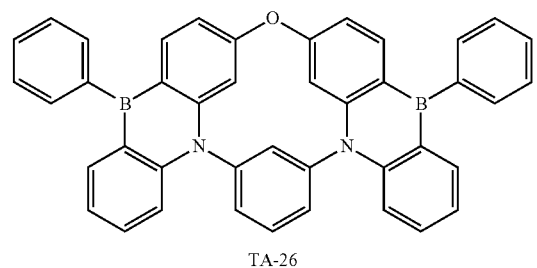

TA-26

Synthesis of Compound TA-26

Pd$_2$(dba)$_3$ (0.03 eq), (t-Bu)$_3$P (0.06 eq), NaOt-Bu(1 eq), and toluene (0.1 M based on 1 eq reagent) were added to a flask containing 1,3-dibromobenzene (1 eq) and 3,3'-oxybis(10-phenyl-5,10-dihydrodibenzo[b,e][1,4]azaborinine) (1.2 eq), and the mixture was refluxed and stirred for 5 hours. Thereafter, the mixture was cooled to room temperature, and extracted with MC, and washed with distilled water. The extracted solution was dried over MgSO$_4$, and distilled under reduced pressure, and then the residue was separated by column chromatography to obtain a compound TA-26 (yield of 37%). An [M]+ value of the compound TA-26, as measured by a high-resolution mass spectrometer, was 597.

2. Manufacture and evaluation of organic electroluminescence devices including the polycyclic compound 2-1. Examples of organic electroluminescence devices including the polycyclic compound Organic electroluminescence devices in Examples 1 to 7 and Comparative Examples 1 to 4 were manufactured using the compounds TA-01, TA-03, TA-04, TA-07, TA-08, TA-11, and TA-26 in Examples and the compounds C1 to C4 in Comparative Examples, respectively, as dopant materials in an emission layer.

Compounds in Examples

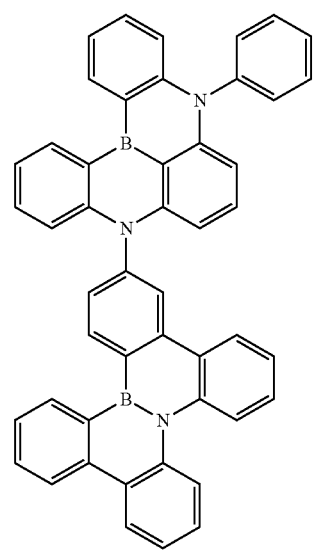
TA-01

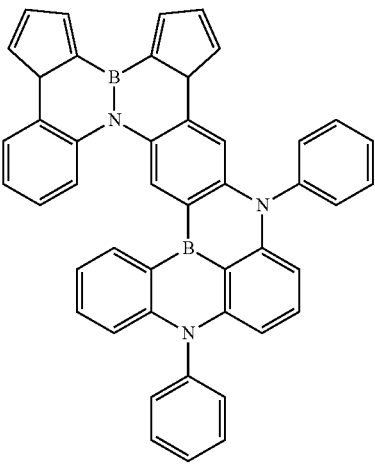
TA-03

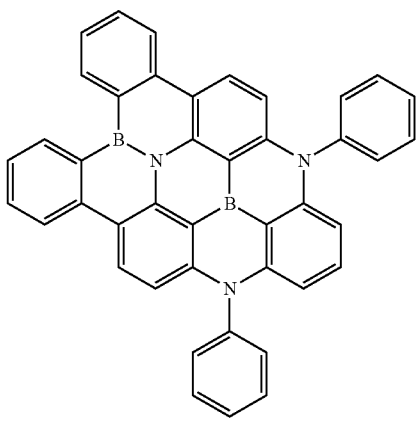
TA-04

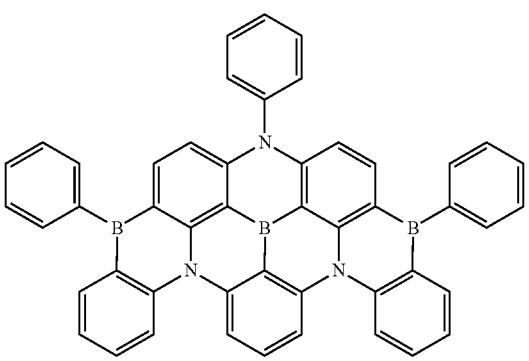
TA-07

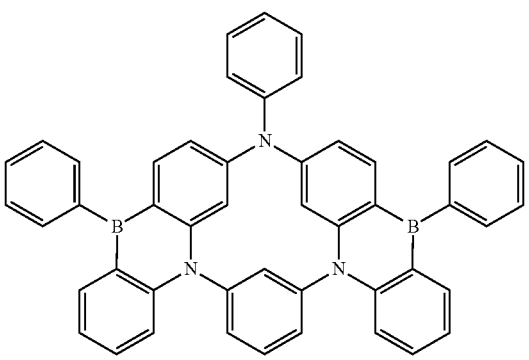
TA-08

TA-11
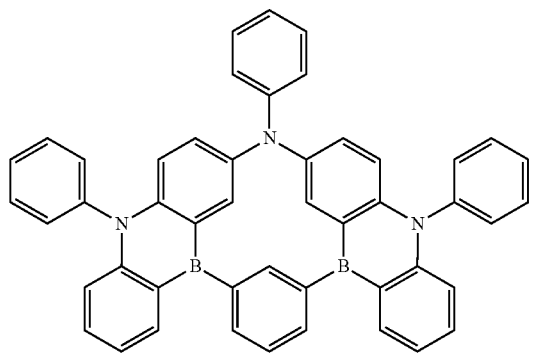
TA-26
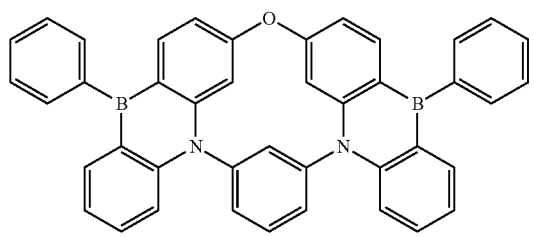
Compounds in Comparative Examples
C1
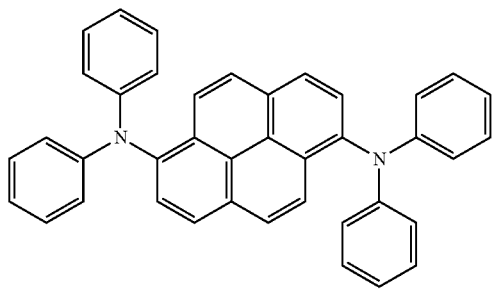
C2
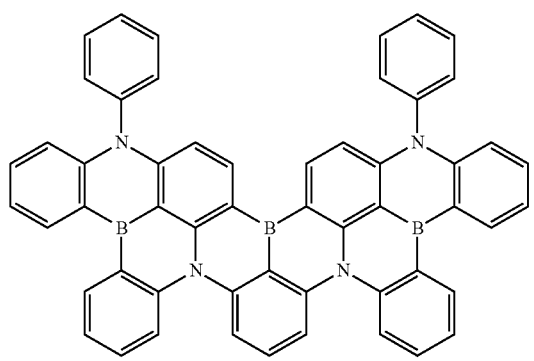
C3
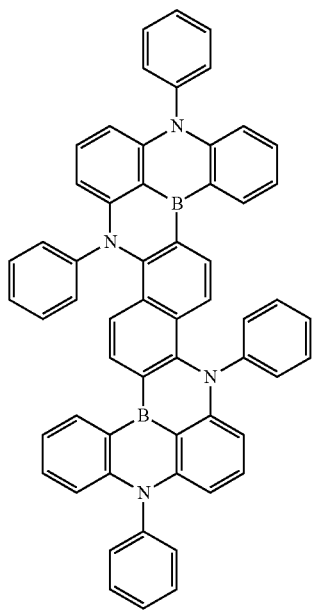
C4
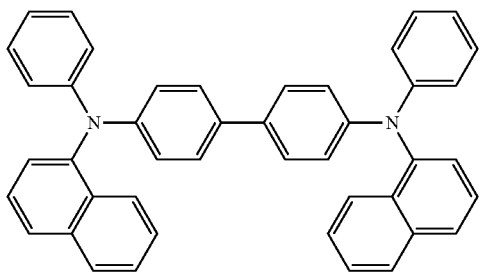
Organic Layer Materials
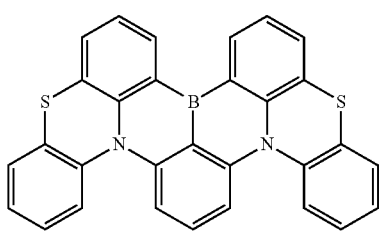
NPB
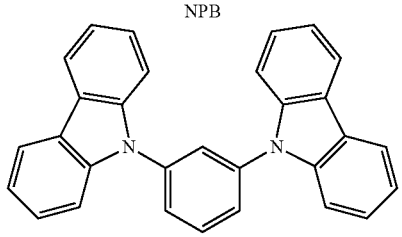
mCP

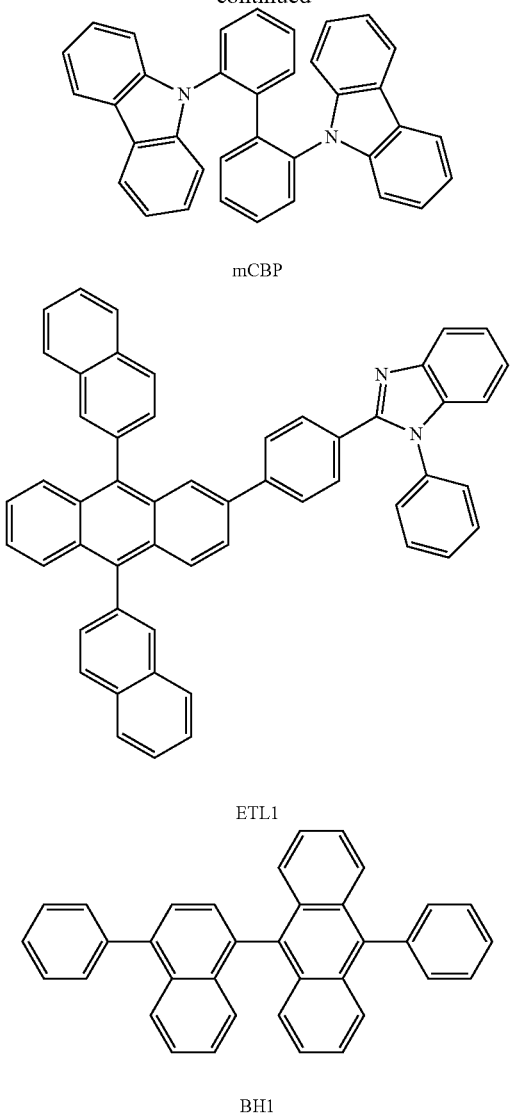

mCBP

ETL1

BH1

Measurement of $\Delta E_{ST}$ Value

Singlet energy levels (S1 energy levels) and triplet energy levels (T1 energy levels) of compounds TA-01, TA-03, TA-04, TA-07, TA-08, TA-11, and TA-26 in the Examples were calculated using a nonempirical molecular orbital method. Specifically, the calculations for the S1 energy levels and T1 energy levels of the foregoing compounds were performed using the Gaussian09 software program available from Gaussian Inc. These density functional theory (DFT) calculations were performed utilizing the B3LYP hybrid functional and the 6-31G(d) basis set (B3LYP/6-31G(d)).

Table 1 shows the S1 energy levels, the T1 energy levels, and the $\Delta E_{ST}$ values of the compounds TA-01, TA-03, TA-04, TA-07, TA-08, TA-11, and TA-26 in the Examples.

TABLE 1

| Compound | S1 energy level | T1 energy level | $\Delta E_{ST}$ |
|---|---|---|---|
| Compound TA-01 in Example 1 | 2.69 | 2.56 | 0.13 |

TABLE 1-continued

| Compound | S1 energy level | T1 energy level | $\Delta E_{ST}$ |
|---|---|---|---|
| Compound TA-03 in Example 2 | 2.81 | 2.61 | 0.02 |
| Compound TA-04 in Example 3 | 2.82 | 2.58 | 0.132 |
| Compound TA-07 in Example 4 | 2.79 | 2.6 | 0.16 |
| Compound TA-08 in Example 5 | 2.83 | 2.63 | 0.2 |
| Compound TA-11 in Example 6 | 2.85 | 2.64 | 0.21 |
| Compound TA-26 in Example 7 | 2.8 | 2.56 | 0.13 |

In Table 1, LEST represents a difference value between a singlet energy level and a triplet energy level. In Table 1, the S1 and T1 energy level units are eV. The compounds in the Examples all have a value less than 0.3, which is an upper limit value of LEST understood to allow for emission of thermally activated delayed fluorescence, and thus, it is found that the compounds may be used as a thermally activated delayed fluorescent material.

(Manufacture of Organic Electroluminescence Devices)

In the organic electroluminescence devices of Examples 1 to 7 and Comparative Examples 1 to 4, a first electrode EL1 having a thickness of about 500 Å was formed of ITO. A hole injection layer HIL having a thickness of about 400 Å was formed of NPB, and a hole transport layer HTL having a thickness of 10 Å was formed of mCP. An emission layer EML having a thickness of 200 Å was formed by doping 3% of the compounds in the Examples and the Comparative Examples in addition to mCBP. An electron transport layer ETL having a thickness of 300 Å was formed using compound ETL1, and a second electrode EL2 having a thickness of 1200 Å was formed of Al. Each layer was formed through a vacuum deposition method. The organic electroluminescence device of Comparative Example 1 was manufactured in substantially the same manner as the organic electroluminescence devices of Examples 1 to 7 except that BH1/C1 was used as a host/dopant for the emission layer.

Evaluation of Characteristics of Organic Electroluminescence Device

Evaluation of characteristics of the manufactured organic electroluminescence device was performed using a luminance orientation characteristic measuring apparatus. To evaluate the characteristics of the organic electroluminescence device according to the Examples and the Comparative Examples, a driving voltage, current efficiency, and external quantum efficiency were measured. The current efficiency is a value with respect to a current density of 10 mA/cm². The evaluation results in Table 2 are represented based on the maximum luminous efficiency and the half-life time of luminance in Comparative Example 1 using DPEPO as a host material (100%).

TABLE 2

| Device manufacturing example | Emission layer dopant | Driving voltage (V) | Current efficiency (cd/A) | External quantum efficiency (%) |
|---|---|---|---|---|
| Example 1 | compound TA-01 | 4.7 | 25.3 | 16 |
| Example 2 | compound TA-03 | 4.4 | 27.0 | 18.4 |

TABLE 2-continued

| Device manufacturing example | Emission layer dopant | Driving voltage (V) | Current efficiency (cd/A) | External quantum efficiency (%) |
|---|---|---|---|---|
| Example 3 | compound TA-04 | 5.2 | 23.0 | 14.4 |
| Example 4 | compound TA-07 | 4.4 | 26.7 | 17.7 |
| Example 5 | compound TA-08 | 4.7 | 20.1 | 17.6 |
| Example 6 | compound TA-11 | 4.9 | 19.54 | 16.7 |
| Example 7 | compound TA-26 | 4.8 | 22.6 | 15.5 |
| Comparative Example 1 | compound C1 | 7.44 | 4.84 | 2.99 |
| Comparative Example 2 | compound C2 | 5.4 | 18.7 | 13.7 |
| Comparative Example 3 | compound C3 | 5.7 | 16.2 | 12.1 |
| Comparative Example 4 | compound C4 | 5.9 | 10.4 | 11.7 |

Referring to the results in Table 2, it can be seen that when a polycyclic compound according to an embodiment of the present disclosure was applied as a dopant material for an emission layer to an organic electroluminescence device, a low driving voltage and high efficiency were achieved. For example, it can be seen that a low driving voltage and high efficiency were realized in Examples 1 to 7 as compared with Comparative Examples 1 to 4. In Examples 1 to 7, a low driving voltage and high efficiency were achieved because the drive voltage was 4.4-5.2 V, the current efficiency was 19.54-27 cd/A, and the external quantum efficiency was 14.4-18.4%. In Comparative Examples 1 to 4, a low driving voltage and high efficiency was not achieved because the driving voltage was 5.4-7.44 V, the current efficiency was 4.84-18.7 cd/A, and the external quantum efficiency was 2.99-13.7%.

The compounds in Examples 1 to 3 of the present disclosure have boron to nitrogen (B-N) direct bonds, so that it may be considered that the compounds have electrochemical characteristics different from those in the Comparative Example 3 which do not include a B-N direct bond. Accordingly, it may be considered that a low driving voltage and high efficiency of the device are achieved by using a polycyclic compound according to embodiments of the present disclosure.

In Examples 4 to 7 of the present disclosure, the heteroatoms of the polycyclic compounds are substituted at the Y4 position of Formula 1-2, so that the compounds of Examples 4 to 7 have increased planarity as compared to the compounds in the Comparative Examples. Accordingly, it may be considered that a low driving voltage and high efficiency of the resultant devices are achieved because the compounds have different stereochemical characteristics compared with the compounds in Comparative Examples.

According to an embodiment of the present disclosure, the organic electroluminescence device having a low driving voltage and high efficiency may be achieved.

According to an embodiment of the present disclosure, the polycyclic compound may be applied to an organic electroluminescence device to contribute to lowering of a driving voltage and improving of efficiency.

As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although exemplary embodiments of the present disclosure have been described, it is understood that the present disclosure should not be limited to these exemplary embodiments but various changes and modifications can be made by one ordinary skilled in the art within the spirit and scope of the appended claims, and equivalents thereof.

Claimed is:
1. An organic electroluminescence device comprising:
a first electrode;
a second electrode on the first electrode; and
a plurality of organic layers between the first electrode and the second electrode,
wherein the first electrode and the second electrode each independently comprise at least one selected from the group consisting of Ag, Mg, Cu, Al, Pt, Pd, Au, Ni, Nd, Ir, Cr, Li, Ca, LiF/Ca, LiF/Al, Mo, Ti, In, Sn, Zn, a compound of two or more thereof, a mixture of two or more thereof, and oxides thereof, and
wherein at least one organic layer of the plurality of organic layers comprises a polycyclic compound represented by Formula 1-1 or Formula 1-2:

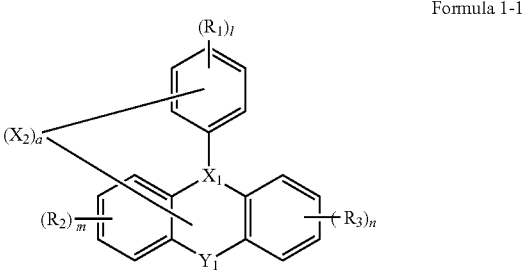

Formula 1-1

-continued

Formula 1-2

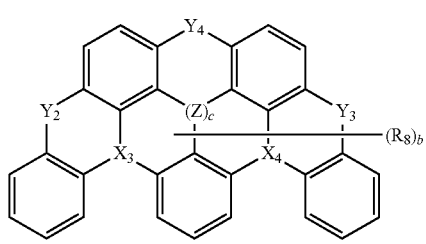

in Formula 1-1,
R₁ to R₃ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to adjacent groups to form a condensed polycyclic ring,
l to n are each independently an integer of 0 to 4,
$X_1$ is B or N,
$X_2$ is $BR_{1-1}$ or $NR_{1-2}$,
$R_{1-1}$ and $R_{1-2}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms,
a is 1 or 2,
$Y_1$ is O, S, $BR_4$, or $NR_5$,
$R_4$ and $R_5$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to adjacent groups to form a condensed polycyclic ring, and
at least one of $R_1$ to $R_5$ is bonded to adjacent groups to form a condensed polycyclic ring having a B-N direct bond, or is a heteroaryl group having a B-N direct bond,
in Formula 1-2,
$X_3$ and $X_4$ are each independently B or N,
$Y_2$ to $Y_4$ are each independently $BR_6$, $NR_7$, O, or S,
$R_6$ and $R_7$ are each independently a hydrogen atom, a deuterium atom, a substituted or unsubstituted alkyl group having 1 to 30 carbon atoms, or a substituted or unsubstituted aryl group having 6 to 30 ring-forming carbon atoms,
$R_8$ is a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms,
b is an integer of 0 to 15,
Z is B or N,
c is 0 or 1, and
wherein when Z is B and c is 1, at least one of $Y_2$ or $Y_3$ is $BR_6$, and the remaining of $Y_2$ or $Y_3$ is $NR_7$, or S.

2. The organic electroluminescence device of claim 1, wherein the polycyclic compound is represented by Formula 2-1-1 or Formula 2-1-2:

Formula 2-1-1

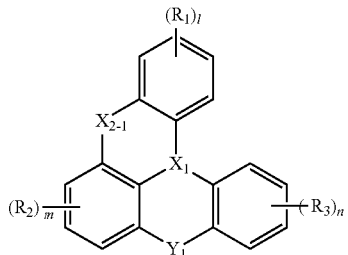

Formula 2-1-2

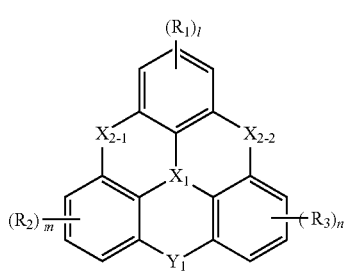

in Formula 2-1-1 and Formula 2-1-2,
$X_{2-1}$ and $X_{2-2}$ are each independently $BR_{1-1}$ or $NR_{1-2}$, and
$R_1$ to $R_3$, l to n, and $X_1$, $Y_1$, $R_{1-1}$ and $R_{1-2}$ are the same as defined in Formula 1-1.

3. The organic electroluminescence device of claim 1, wherein the polycyclic compound is represented by Formula 3-1-1 or Formula 3-1-2:

Formula 3-1-1

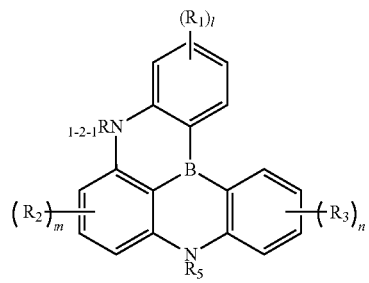

Formula 3-1-2

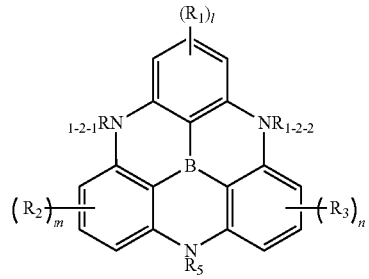

in Formula 3-1-1 and Formula 3-1-2,
$NR_{1-2-1}$ and $NR_{1-2-2}$ are each independently $NR_{1-2}$, and
$R_1$ to $R_3$, l to n, $R_{1-2}$ and $R_5$ are the same as defined in Formula 1-1.

4. The organic electroluminescence device of claim 1, wherein the polycyclic compound is represented by Formula 4-1:

Formula 4-1

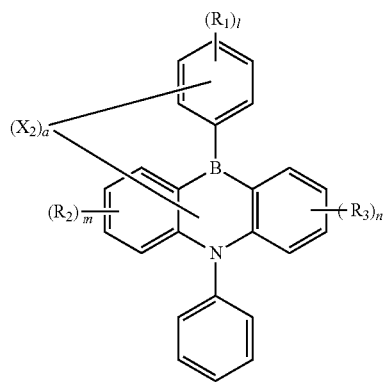

in Formula 4-1,
$R_1$ to $R_3$, l to n, $X_2$ and a are the same as defined in Formula 1-1.

5. The organic electroluminescence device of claim 1, wherein the polycyclic compound is represented by Formulae 2-2-1 to 2-2-3:

Formula 2-2-1

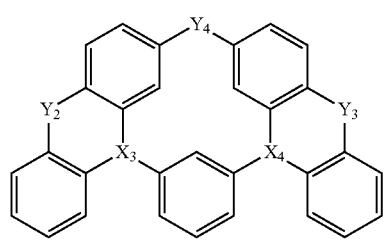

Formula 2-2-2

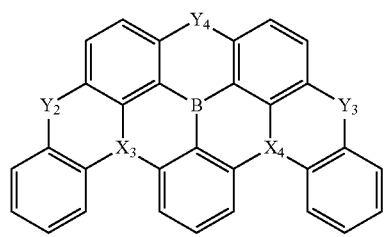

Formula 2-2-3

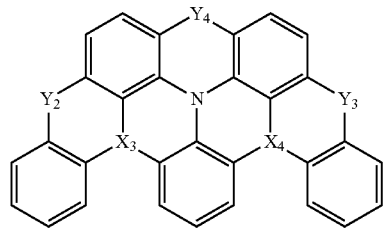

in Formulae 2-2-1 to 2-2-3,
$X_3$, $X_4$ and $Y_2$ to $Y_4$ are the same as defined in Formula 1-2.

6. The organic electroluminescence device of claim 1, wherein $R_6$ and $R_7$ are unsubstituted phenyl groups.

7. The organic electroluminescence device of claim 1, wherein two or three selected from $X_3$, $X_4$, or $Y_2$ to $Y_4$ in Formula 1-2 comprise B.

8. The organic electroluminescence device of claim 1, wherein the plurality of organic layers respectively comprise:

a hole transport region on the first electrode;
an emission layer on the hole transport region; and
an electron transport region on the emission layer,
wherein the emission layer comprises the polycyclic compound.

9. The organic electroluminescence device of claim 8, wherein the emission layer comprises a host and a dopant, and
the dopant comprises the polycyclic compound.

10. The organic electroluminescence device of claim 9, wherein the polycyclic compound is a thermally activated delayed fluorescent dopant.

11. The organic electroluminescence device of claim 8, wherein
the emission layer is configured to emit blue light in a wavelength range of 440 to 490 nm.

12. The organic electroluminescence device of claim 1, wherein the polycyclic compound comprises at least one of the compounds represented in Compound Group 1:

Compound Group 1

TA-01

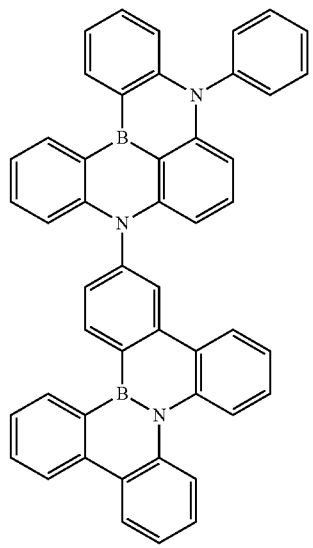

TA-02

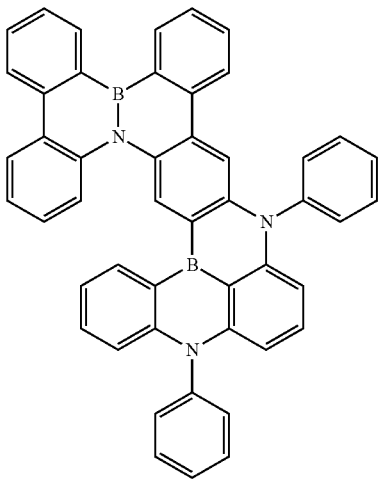

TA-03
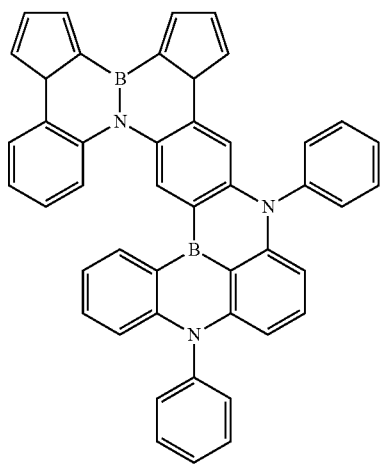
TA-07
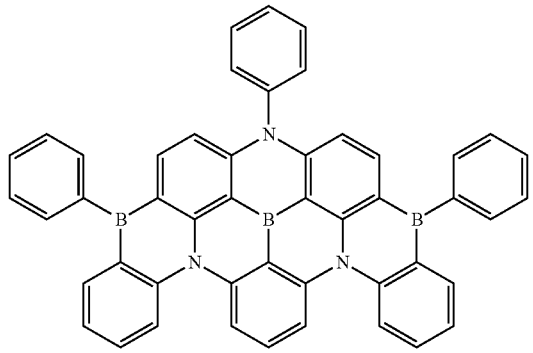
TA-04
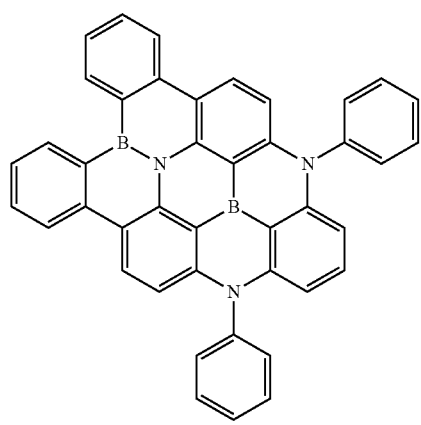
TA-08
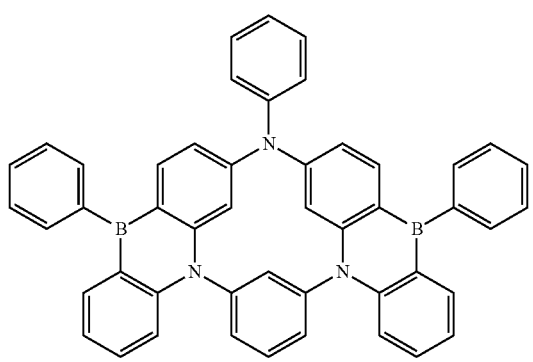
TA-05
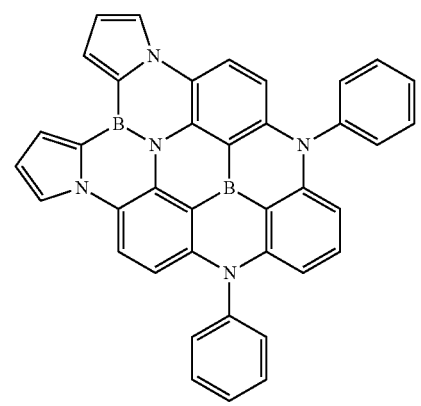
TA-09
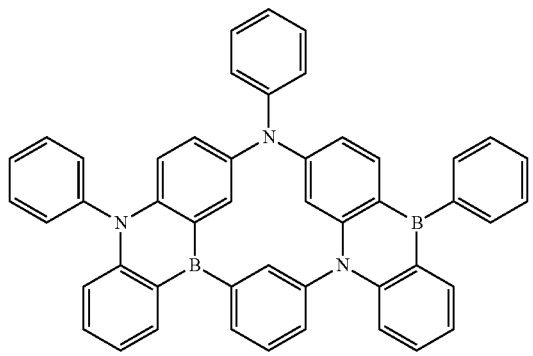
TA-06
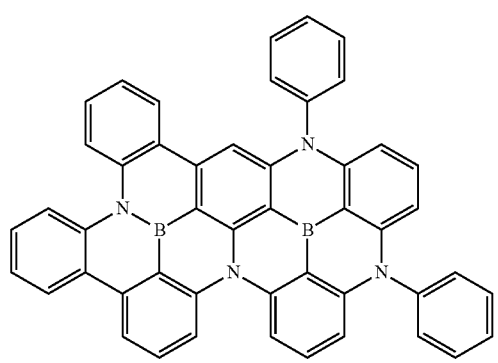
TA-10
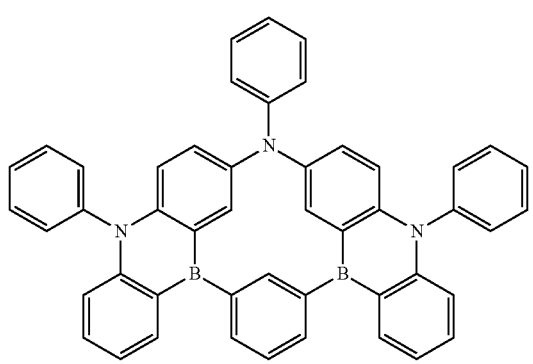

TA-11
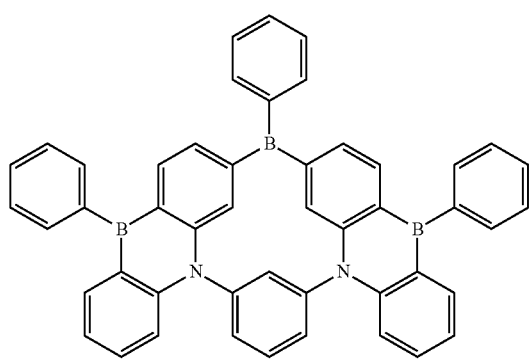
TA-12
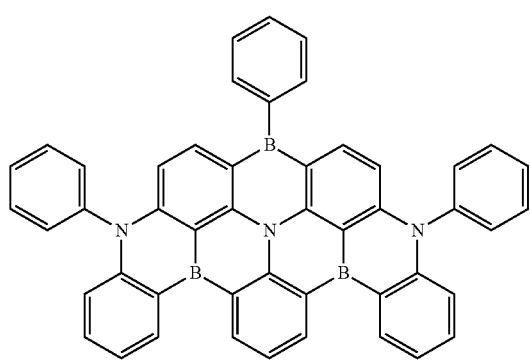
TA-13
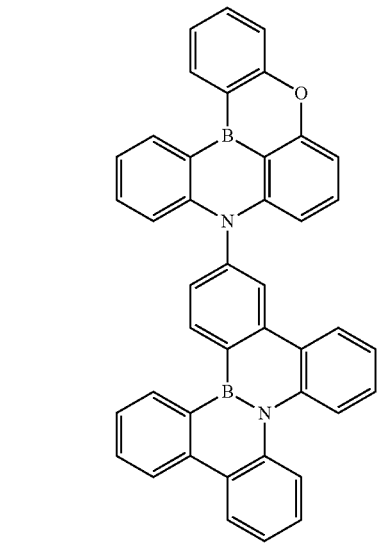
TA-14
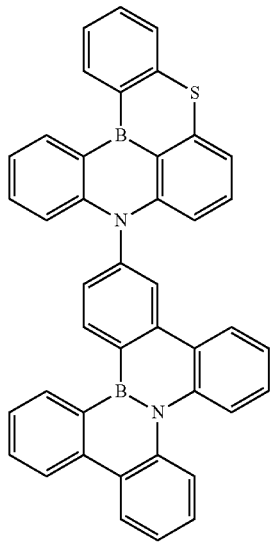
TA-15
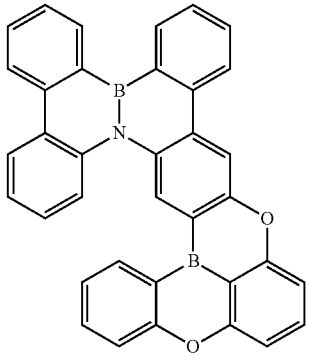
TA-16
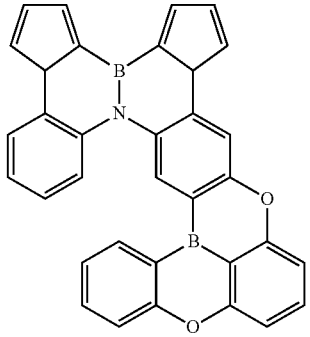
TA-17
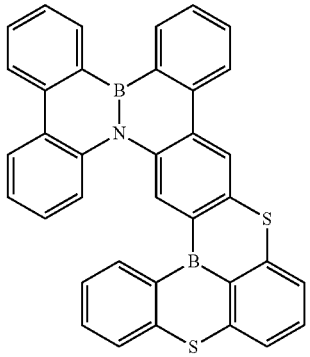

-continued
TA-18
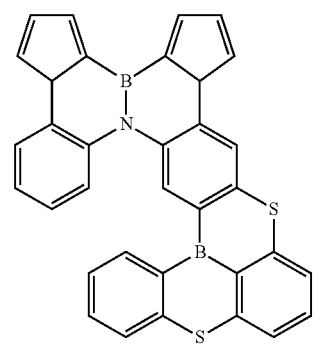
TA-19
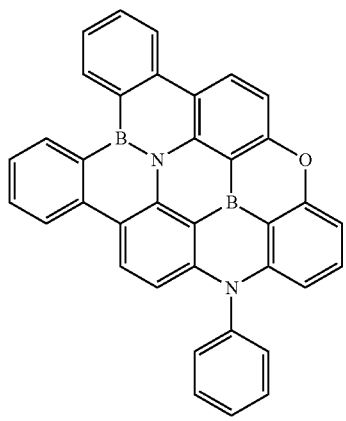
TA-20
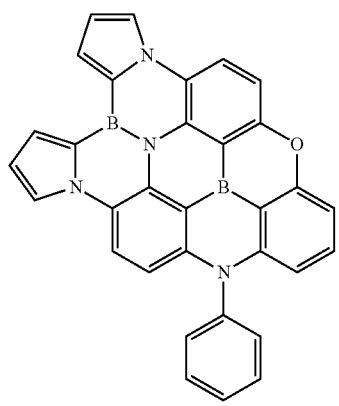
TA-21
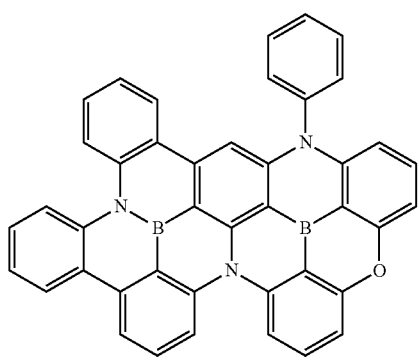
-continued
TA-22
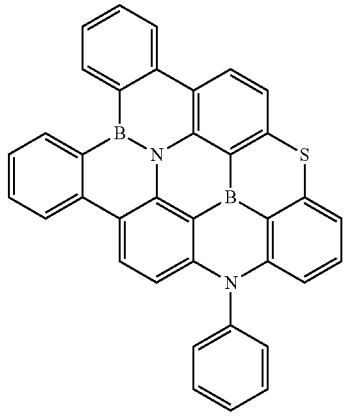
TA-23
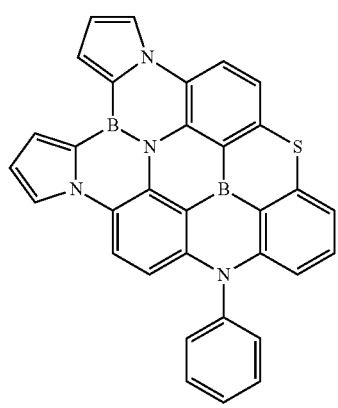
TA-24
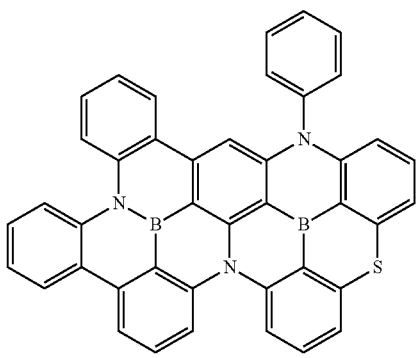
TA-25
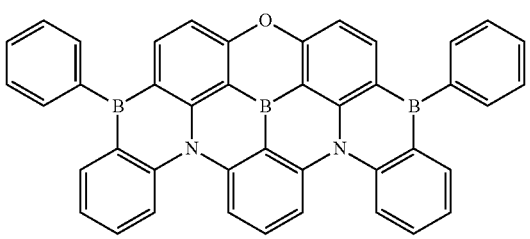

TA-26
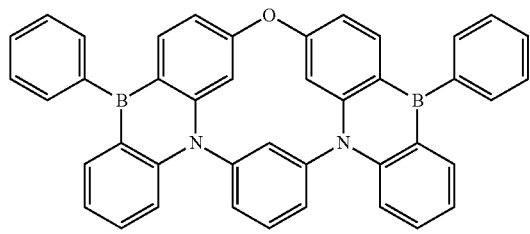
TA-27
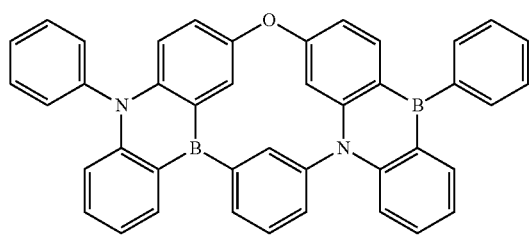
TA-28
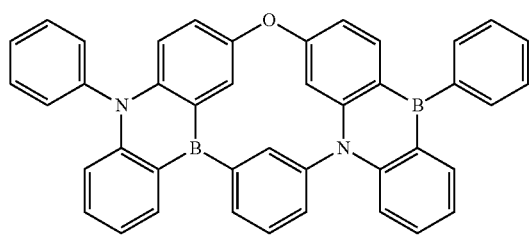
TA-29
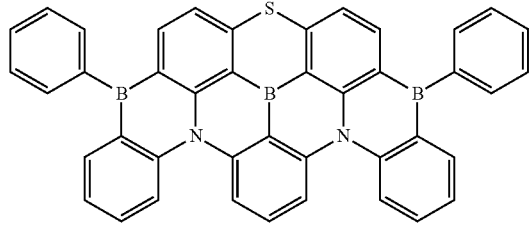
TA-30
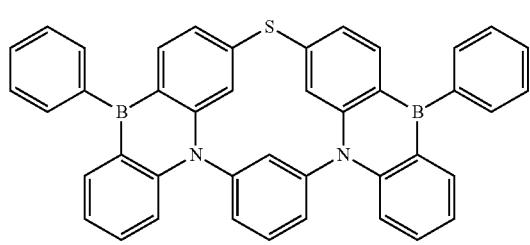
TA-31
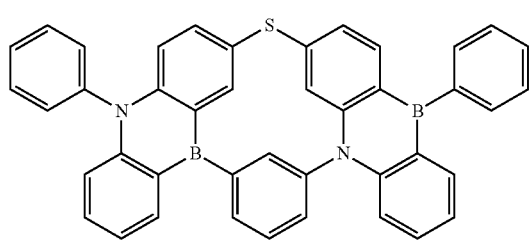
TA-32
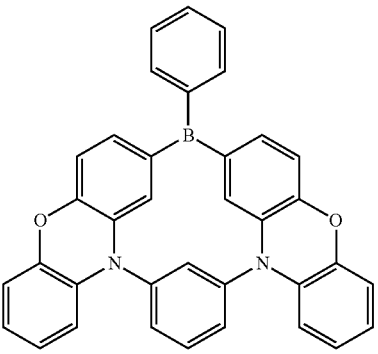
TA-33
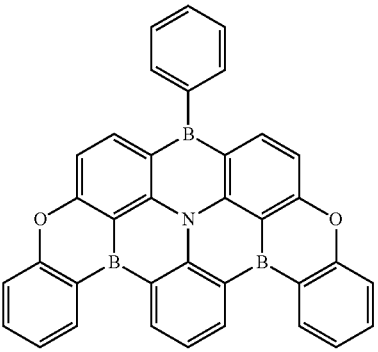
TA-34
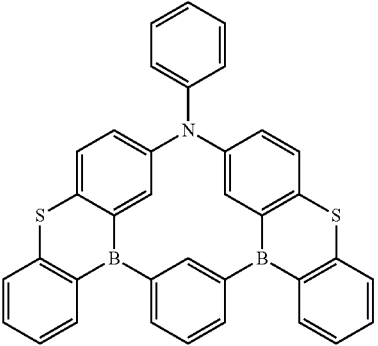
TA-35
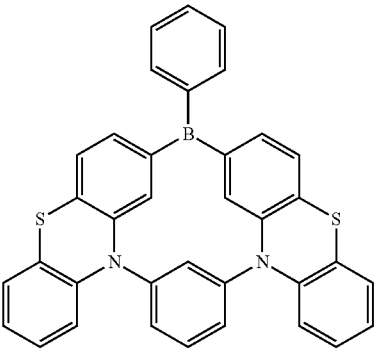

-continued

TA-36

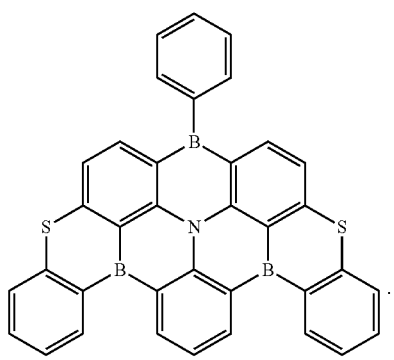

13. A polycyclic compound represented by Formula 1-1 or Formula 1-2:

Formula 1-1

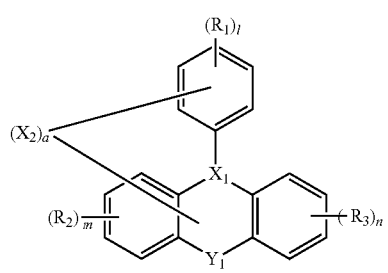

Formula 1-2

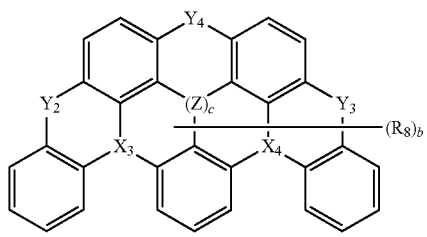

in Formula 1-1,

R$_1$ to R$_3$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to adjacent groups to form a condensed polycyclic ring, l to n are each independently an integer of 0 to 4, X$_1$ is B or N, X$_2$ is BR$_{1-1}$ or NR$_{1-2}$, R$_{1-1}$ and R$_{1-2}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, a is 1 or 2, Y$_1$ is O, S, BR$_4$, or NR$_5$, R$_4$ and R$_5$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to adjacent groups to form a condensed polycyclic ring, and at least one of R$_1$ to R$_5$ is bonded to adjacent groups to form a condensed polycyclic ring having a B-N direct bond, or is a heteroaryl group having a B-N direct bond, in Formula 1-2, X$_3$ and X$_4$ are each independently B or N, Y$_2$ to Y$_4$ are each independently BR$_6$, NR$_7$, O, or S, R$_6$ and R$_7$ are each independently a hydrogen atom, a deuterium atom, a substituted or unsubstituted alkyl group having 1 to 30 carbon atoms, or a substituted or unsubstituted aryl group having 6 to 30 ring-forming carbon atoms, R$_8$ is a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, b is an integer of 0 to 15, Z is B or N, c is 0 or 1, and wherein when Z is B and c is 1, at least one of Y$_2$ or Y$_3$ is BR$_6$, and the the remaining of Y$_2$ or Y$_3$ is NR$_7$, or S.

14. The polycyclic compound of claim 13, wherein the polycyclic compound is represented by Formula 2-1-1 or Formula 2-1-2:

Formula 2-1-1

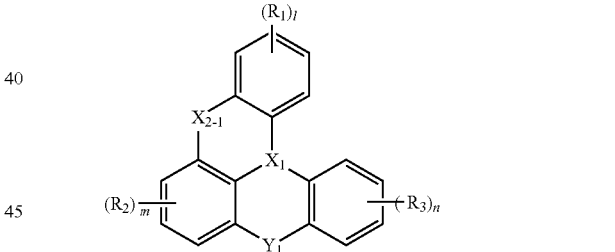

Formula 2-1-2

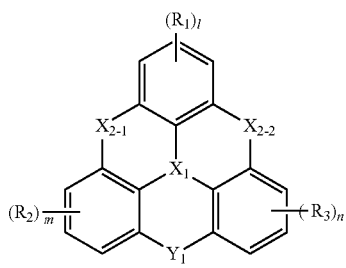

in Formula 2-1-1 and Formula 2-1-2,

X$_{2-1}$ and X$_{2-2}$ are each independently BR$_{1-1}$ or NR$_{1-2}$, and

R$_1$ to R$_3$, l to n, and R$_{1-2}$ are the same as defined in Formula 1-1.

15. The polycyclic compound of claim 13, wherein the polycyclic compound is represented by Formula 3-1-1 or Formula 3-1-2:

Formula 3-1-1

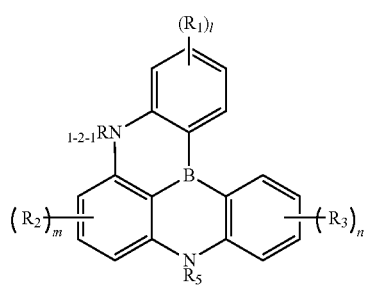

Formula 3-1-2

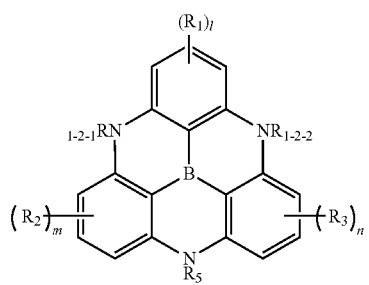

in Formula 3-1-1 and Formula 3-1-2,
$NR_{1\text{-}2\text{-}1}$ and $NR_{1\text{-}2\text{-}2}$ are each independently $NR_{1\text{-}2}$, and $R_1$ to $R_3$, l to n, $R_{1\text{-}2}$ and $R_5$ are the same as defined in Formula 1-1.

16. The polycyclic compound of claim 13, wherein the polycyclic compound is represented by Formula 4-1:

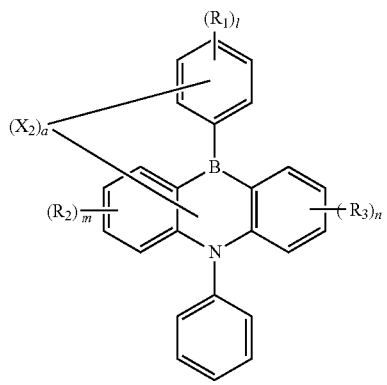

Formula 4-1 in Formula 4-1,
$R_1$ to $R_3$, l to n, $X_2$ and a are the same as defined in Formula 1-1.

17. The polycyclic compound of claim 13, wherein the polycyclic compound is represented by Formulae 2-2-1 to 2-2-3:

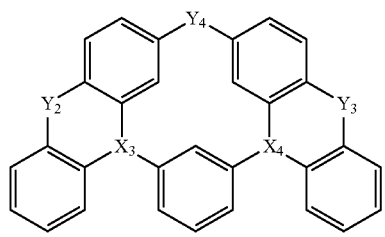

Formula 2-2-1

Formula 2-2-2

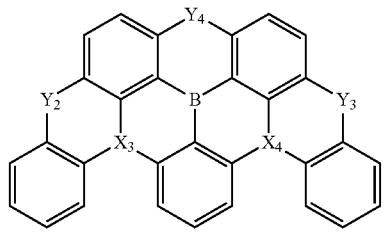

Formula 2-2-3 in Formulae 2-2-1 to 2-2-3,
$X_3$, $X_4$ and $Y_2$ to $Y_4$ are the same as defined in Formula 1-2.

18. The polycyclic compound of claim 13, wherein $R_6$ and $R_7$ are unsubstituted phenyl groups.

19. The polycyclic compound of claim 13, wherein two or three selected from $X_3$, $X_4$, or $Y_2$ to $Y_4$ in Formula 1-2 comprise B.

20. The polycyclic compound of claim 13, wherein the polycyclic compound represented by any one of the compounds represented in Compound Group 1:

Compound Group 1

TA-01

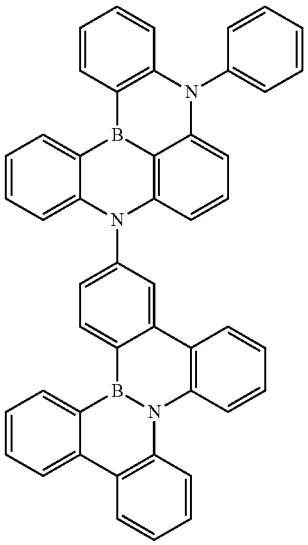

TA-02
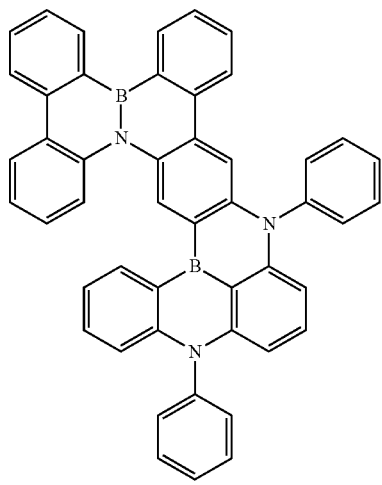
TA-03
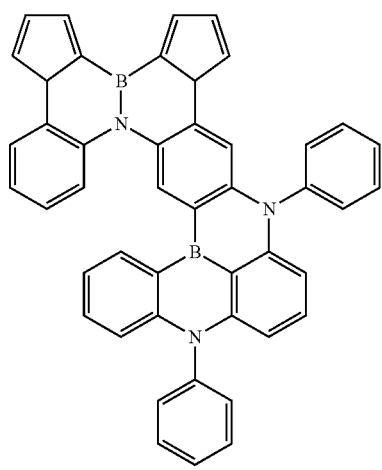
TA-04
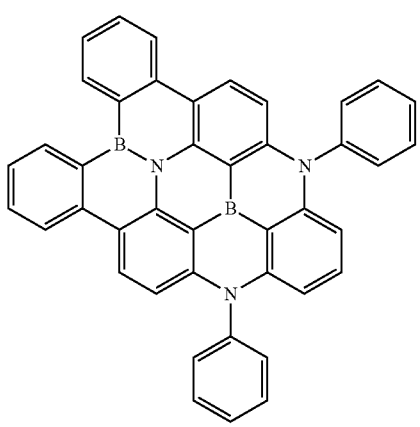
TA-05
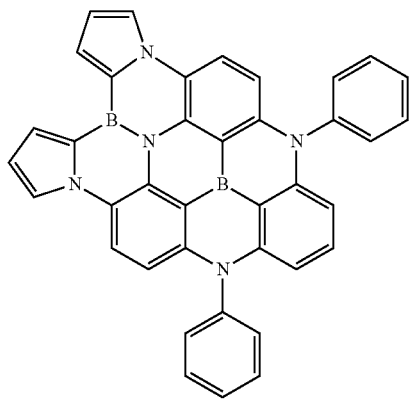
TA-06
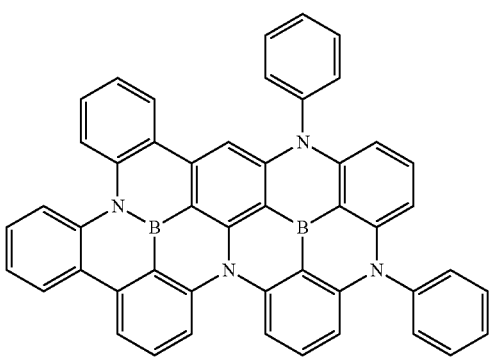
TA-07
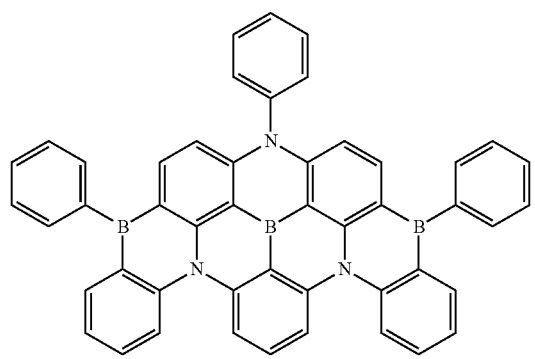
TA-08
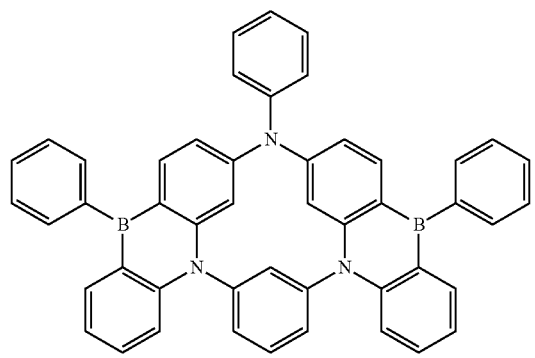

-continued
TA-09
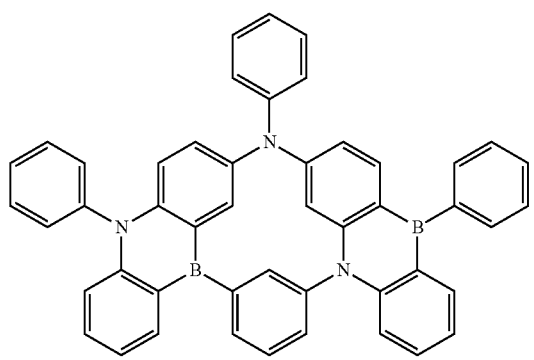
TA-10
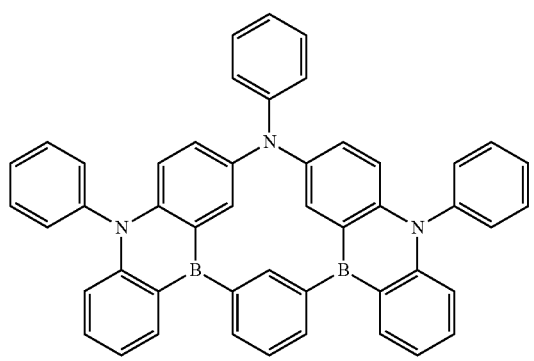
TA-11
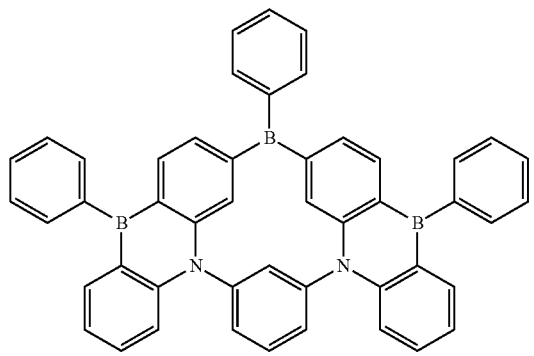
TA-12
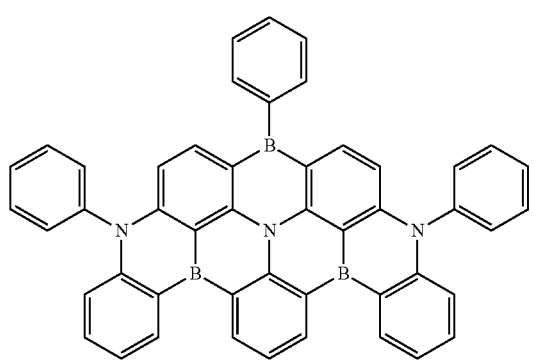
TA-13
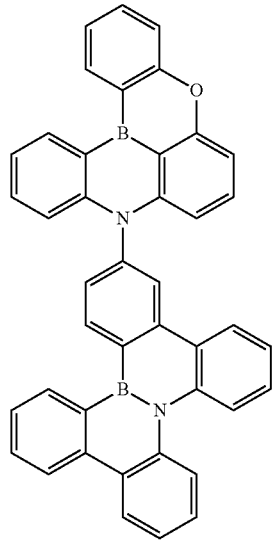
TA-14
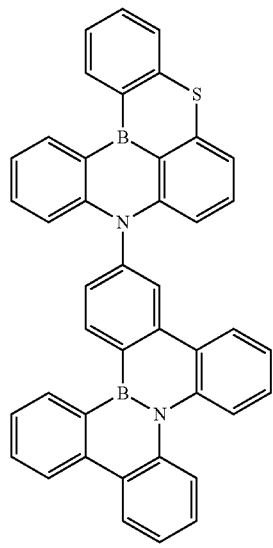
TA-15
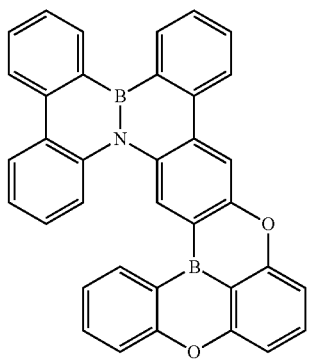

TA-16
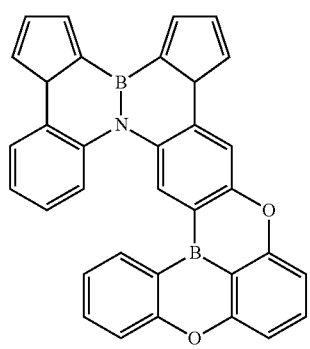
TA-17
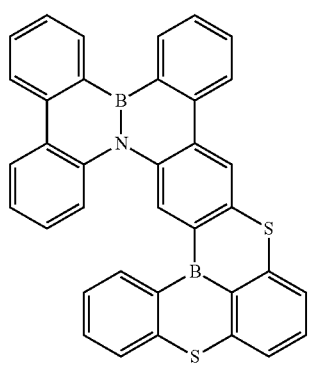
TA-18
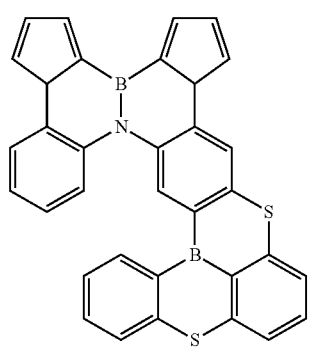
TA-19
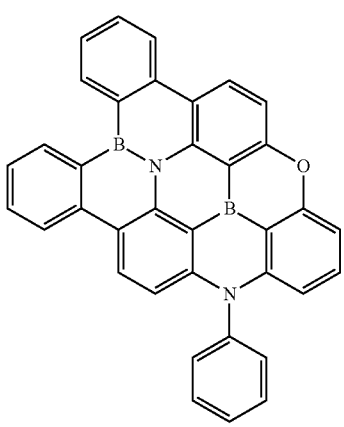
TA-20
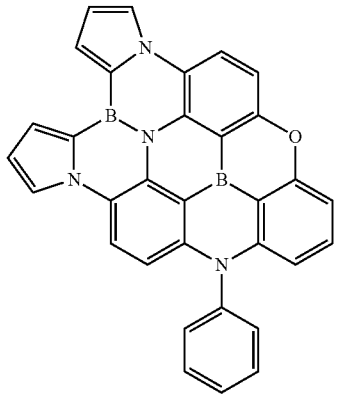
TA-21
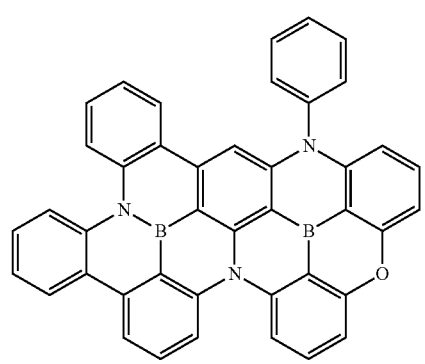
TA-22
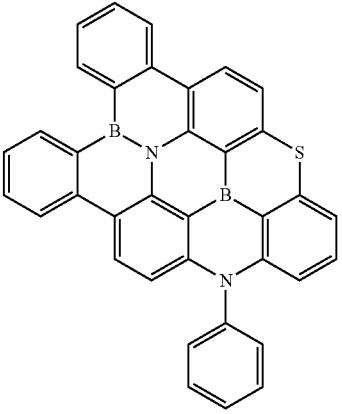
TA-23
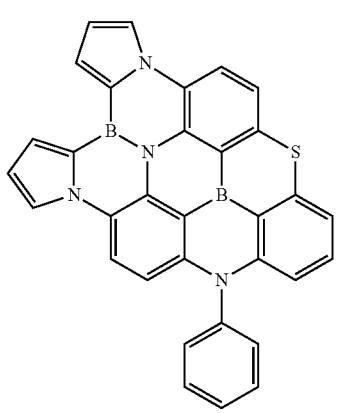

TA-24
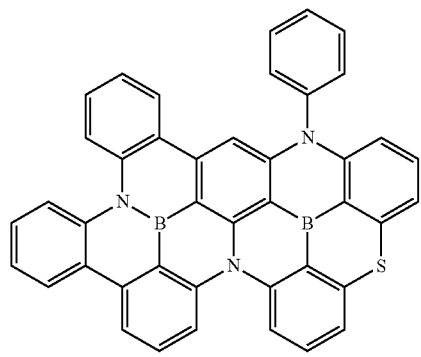
TA-29
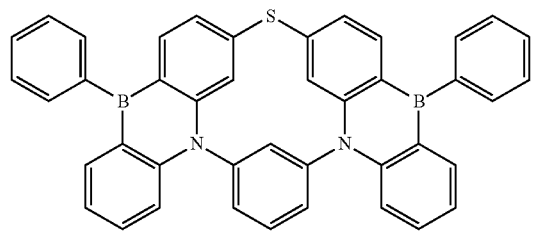
TA-25
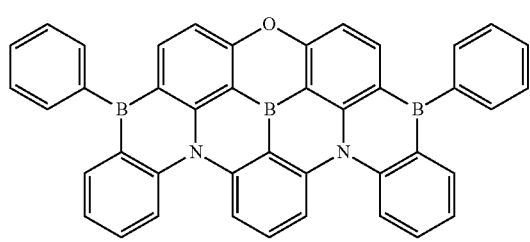
TA-30
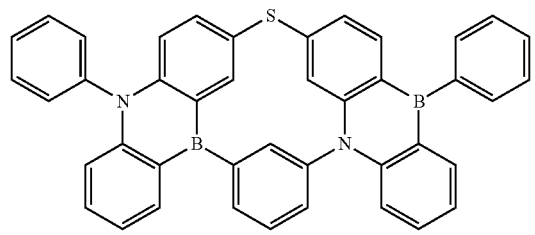
TA-26
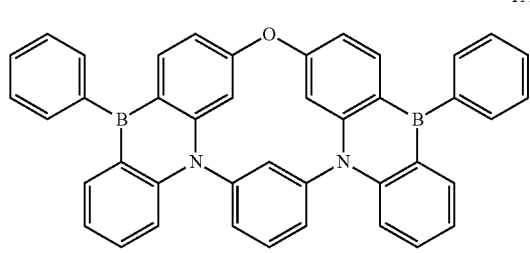
TA-31
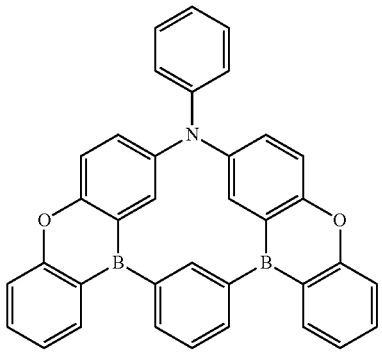
TA-27
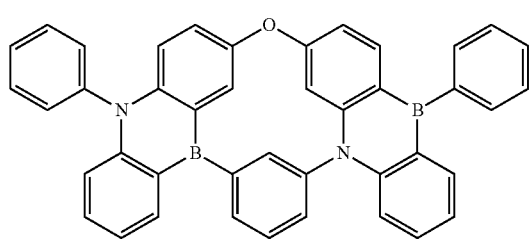
TA-28
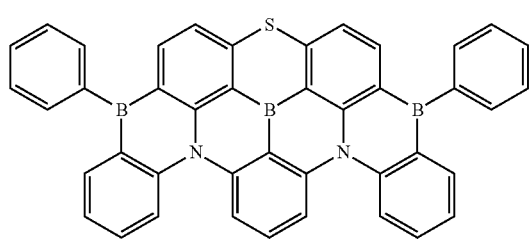
TA-32
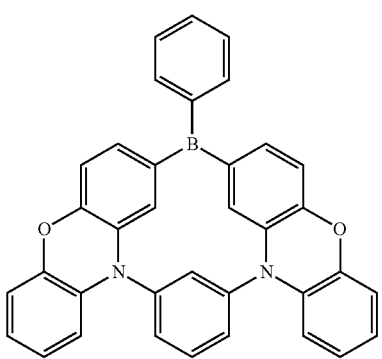

TA-33
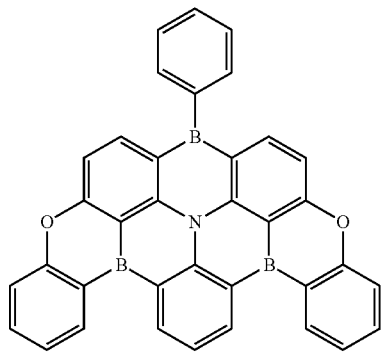
TA-34
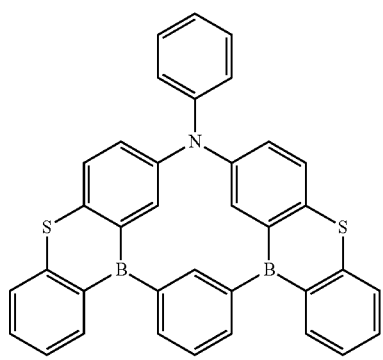
TA-35
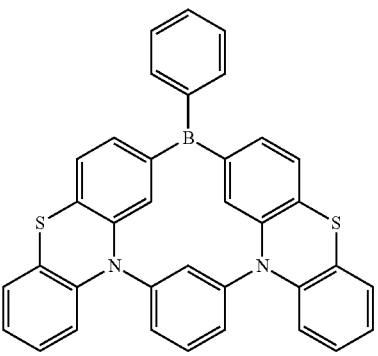
TA-36
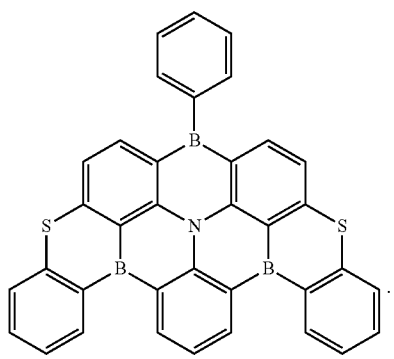
* * * * *